United States Patent
Hatori et al.

(10) Patent No.: US 10,063,217 B2
(45) Date of Patent: Aug. 28, 2018

(54) CURRENT-TO-VOLTAGE CONVERSION CIRCUIT AND SELF-OSCILLATION CIRCUIT

(71) Applicant: YOKOGAWA ELECTRIC CORPORATION, Musashino-shi, Tokyo (JP)

(72) Inventors: Daisuke Hatori, Tokyo (JP); Takashi Yoshida, Tokyo (JP); Tadahiko Takayama, Tokyo (JP); Yusaku Yoshida, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 459 days.

(21) Appl. No.: 14/717,046

(22) Filed: May 20, 2015

(65) Prior Publication Data
US 2015/0341018 A1    Nov. 26, 2015

(30) Foreign Application Priority Data
May 23, 2014   (JP) ................................. 2014-107185

(51) Int. Cl.
*H03K 3/01* (2006.01)
*H02J 4/00* (2006.01)
(Continued)

(52) U.S. Cl.
CPC .......... *H03K 3/01* (2013.01); *G01C 19/5776* (2013.01); *H02J 4/00* (2013.01); *H03B 5/30* (2013.01); *Y10T 307/658* (2015.04)

(58) Field of Classification Search
None
See application file for complete search history.

(56) References Cited

U.S. PATENT DOCUMENTS 3,577,072 A    5/1971   Miller
4,591,795 A  * 5/1986   McCorkle ............ G01D 5/2208
                                                      324/207.18
(Continued)

FOREIGN PATENT DOCUMENTS

JP      46-27633 B2    8/1971
JP      4172065 A      6/1992
(Continued)

*Primary Examiner* — Thienvu Tran
*Assistant Examiner* — David M Stables
(74) *Attorney, Agent, or Firm* — Sughrue Mion, PLLC

(57) ABSTRACT

A current-to-voltage conversion circuit according to one aspect of the present invention includes a first resistor, a first current source, a first capacitor, a first output terminal, a first voltage source, a first transistor, and a second resistor. The first resistor includes a first end and a second end. The first end of the first resistor is connectable to an electrode included in a sensor and the second end of the first resistor is connected to a first electrical potential. The first capacitor includes a first end and a second end. The first end of the first capacitor is connected to the first end of the first resistor and the second end of the first capacitor is connected to the first current source. The first transistor includes a first terminal, a second terminal, and a control terminal. The first terminal is connected to the second end of the first capacitor, the second terminal is connected to the first output terminal, and the control terminal is connected to the first voltage source. The second resistor includes a first end connected to the second terminal and a second end connected to a second electrical potential.

18 Claims, 10 Drawing Sheets

(51) Int. Cl.
    *G01C 19/5776*    (2012.01)
    *H03B 5/30*        (2006.01)

(56) References Cited

U.S. PATENT DOCUMENTS

| | | | | |
|---|---|---|---|---|
| 4,851,681 | A | * | 7/1989 | DePauli .................... G01J 5/34 250/338.1 |
| 6,023,193 | A | * | 2/2000 | Ierymenko ............ H03F 1/3217 330/146 |
| 2003/0174023 | A1 | * | 9/2003 | Miyasita ............. H03F 3/45085 330/254 |
| 2011/0121907 | A1 | | 5/2011 | Kanai et al. |
| 2014/0266456 | A1 | * | 9/2014 | Vice .................... H03G 1/0017 330/291 |
| 2015/0108210 | A1 | * | 4/2015 | Zhou ........................ H03H 7/18 235/375 |

FOREIGN PATENT DOCUMENTS

| | | |
|---|---|---|
| JP | 2006-71498 A | 3/2006 |
| JP | 2006128916 A | 5/2006 |
| JP | 2008157926 A | 7/2008 |
| JP | 2012156946 A | 8/2012 |

\* cited by examiner

CURRENT-TO-VOLTAGE CONVERSION CIRCUIT AND SELF-OSCILLATION CIRCUIT

BACKGROUND OF THE INVENTION

Field of the Invention

The present invention relates to a current-to-voltage conversion circuit and a self-oscillation circuit.

Priority is claimed on Japanese Patent Application No. 2014-107185, filed on May 23, 2014, the contents of which are incorporated herein by reference.

Description of Related Art

Japanese Unexamined Patent Application, First Publication No. 2006-71498 (hereinafter, referred to as "PTL1") discloses a circuit for converting capacitance changes of an oscillator into voltage changes and outputting the voltage changes. According to the technique disclosed in the PTL 1, a conversion circuit, which includes an operation amplifier, a resistance, and a capacitor, converts the capacitance changes of the oscillator into the voltage changes.

Japanese Examined Patent Publication No. 46-27633 (hereinafter, referred to as "PTL2") discloses a circuit for converting current changes into voltage changes using a capacitor and a transistor including a grounded base.

In the technique disclosed in the PTL 1, an input offset voltage is occurred. The input offset voltage is obtained by converting a voltage (output offset), which is occurred in an output of an operation amplifier when the input into the operation amplifier is zero, into an input value. The input offset voltage changes depending on the influence of temperature, aging, flicker noise, which is certainly decreased as the frequency increases, and the like. When the input offset voltage changes, the errors of the frequency and the amplitude of the output voltage value are occurred during the changing of the voltage applied to the oscillator, which is converted by the operation amplifier. In addition, according to the technique disclosed in the PTL 1, consumption current is occurred for driving the operation amplifier. If the signal-to-noise ratio (SN ratio) of the operation amplifier is improved or the band of the operation amplifier is enlarged, this consumption current is generally increased.

According to the technique disclosed in the PTL 2, compared to the case where an operation amplifier is used, there are some cases where the consumption current is decreased using the transistor. In this case, according to the technique disclosed in the PTL 2, it is necessary to switch on the transistor, which is for executing conversion to obtain output voltage, and to pass the current into a collector of the transistor. However, since the voltage difference between a base and an emitter in the transistor, which is in the range from about 0.3V to about 0.6V, is required, there are some cases where minimal input signals cannot be converted. In addition, according to the technique disclosed in the PTL 2, if the size of the input current changes and the voltage difference between the base and the emitter in the transistor is equal to or less than 0.3V, the operation of the current conversion is stopped. Therefore, there are some cases where the distortion of the waveform of the current output from the transistor is occurred. In addition, according to the technique disclosed in the PTL 2, since the capacitor is used to detect the current, the stabilization of the electrical potential applied to a terminal of the capacitor, which is connected to the transistor, requires long period of time. Therefore, if the output current changes of the oscillator are converted into the voltage changes, there are some cases where the above-stated situations are occurred.

SUMMARY OF THE INVENTION

One aspect of the present invention provides a current-to-voltage conversion circuit and a self-oscillation circuit, which enable reduction of changes of electrical potential of an output electrode included in a sensor and reduction of consumption current in a circuit.

A current-to-voltage conversion circuit according to a first aspect of the present invention may include a first resistor, a first current source, a first capacitor, a first output terminal, a first voltage source, a first transistor, and a second resistor. The first resistor may include a first end and a second end. The first end of the first resistor is connectable to an electrode included in a sensor. The second end of the first resistor may be connected to a first electrical potential. The first capacitor may include a first end and a second end. The first end of the first capacitor may be connected to the first end of the first resistor. The second end of the first capacitor may be connected to the first current source. The first transistor may include a first terminal, a second terminal, and a control terminal. The first terminal may be connected to the second end of the first capacitor. The second terminal may be connected to the first output terminal. The control terminal may be connected to the first voltage source. The second resistor may include a first end and a second end. The first end of the second resistor may be connected to the second terminal. The second end of the second resistor may be connected to a second electrical potential.

In the above-stated current-to-voltage conversion circuit according to the first aspect, the first resistor may be configured to fix an electrical potential input from the sensor.

In the above-stated current-to-voltage conversion circuit according to the first aspect, the first transistor may be a P-type MOS transistor and include a source, a drain, and a gate. The first terminal may be the source. The second terminal may be the drain. The control terminal may be the gate. The second electrical potential may be 0V.

In the above-stated current-to-voltage conversion circuit according to the first aspect, the first transistor may be an N-type MOS transistor and include a source, a drain, and a gate. The first terminal may be the source. The second terminal may be the drain. The control terminal may be the gate. The second electrical potential may be a positive source electrical potential.

In the above-stated current-to-voltage conversion circuit according to the first aspect, the first transistor may be a PNP-type transistor and include an emitter, a collector, and a base. The first terminal may be the emitter. The second terminal may be the collector. The control terminal may be the base. The second electrical potential may be 0V.

In the above-stated current-to-voltage conversion circuit according to the first aspect, the first transistor may be an NPN-type transistor and include an emitter, a collector, and a base. The first terminal may be the emitter. The second terminal may be the collector. The control terminal may be the base. The second electrical potential may be a positive source electrical potential.

In the above-stated current-to-voltage conversion circuit according to the first aspect, the first end of the first resistor is connectable to an oscillator included in the sensor.

In the above-stated current-to-voltage conversion circuit according to the first aspect, the control terminal may be connected to a positive electrode included in the first voltage source.

A current-to-voltage conversion circuit according to a second aspect of the present invention may include a first resistor, a first current source, a first capacitor, a first output terminal, a first voltage source, a first transistor, a second resistor, a third resistor, a second current source, a second capacitor, a second output terminal, a second voltage source, a second transistor, and a fourth resistor. The first resistor may include a first end and a second end. The first end of the first resistor is connectable to a first electrode included in a sensor. The second end of the first resistor may be connected to a first electrical potential. The first capacitor may include a first end and a second end. The first end of the first capacitor may be connected to the first end of the first resistor. The second end of the first capacitor may be connected to the first current source. The first transistor may include a first terminal, a second terminal, and a control terminal. The first terminal of the first transistor may be connected to the second end of the first capacitor. The second terminal of the first transistor may be connected to the first output terminal. The control terminal of the first transistor may be connected to the first voltage source. The second resistor may include a first end and a second end. The first end of the second resistor may be connected to the second terminal of the first transistor. The second end of the second resistor may be connected to a second electrical potential. The third resistor may include a first end and a second end. The first end of the third resistor is connectable to a second electrode included in the sensor. The second end of the third resistor may be connected to a third electrical potential. The second capacitor may include a first end and a second end. The first end of the second capacitor may be connected to the first end of the third resistor. The second end of the second capacitor may be connected to the second current source. The second transistor may include a first terminal, a second terminal, and a control terminal. The first terminal of the second transistor may be connected to the second end of the second capacitor. The second terminal of the second transistor may be connected to the second output terminal. The control terminal of the second transistor may be connected to the second voltage source. The fourth resistor may include a first end and a second end. The first end of the fourth resistor may be connected to the second terminal of the second transistor. The second end of the fourth resistor may be connected to a fourth electrical potential.

In the above-stated current-to-voltage conversion circuit according to the second aspect, each of the first resistor and the third resistor may be configured to fix an electrical potential input from the sensor.

In the above-stated current-to-voltage conversion circuit according to the second aspect, each of the first transistor and the second transistor may be a P-type MOS transistor and include a source, a drain, and a gate. The first terminal of the first transistor and the first terminal of the second transistor may be the source of the first transistor and the source of the second transistor, respectively. The second terminal of the first transistor and the second terminal of the second transistor may be the drain of the first transistor and the drain of the second transistor, respectively. The control terminal of the first transistor and the control terminal of the second transistor may be the gate of the first transistor and the gate of the second transistor, respectively.

In the above-stated current-to-voltage conversion circuit according to the second aspect, each of the first transistor and the second transistor may be an N-type MOS transistor and include a source, a drain, and a gate. The first terminal of the first transistor and the first terminal of the second transistor may be the source of the first transistor and the source of the second transistor, respectively. The second terminal of the first transistor and the second terminal of the second transistor may be the drain of the first transistor and the drain of the second transistor, respectively. The control terminal of the first transistor and the control terminal of the second transistor may be the gate of the first transistor and the gate of the second transistor, respectively.

In the above-stated current-to-voltage conversion circuit according to the second aspect, each of the first transistor and the second transistor may be a PNP-type transistor and include an emitter, a collector, and a base. The first terminal of the first transistor and the first terminal of the second transistor may be the emitter of the first transistor and the emitter of the second transistor, respectively. The second terminal of the first transistor and the second terminal of the second transistor may be the collector of the first transistor and the collector of the second transistor, respectively. The control terminal of the first transistor and the control terminal of the second transistor may be the base of the first transistor and the base of the second transistor, respectively.

In the above-stated current-to-voltage conversion circuit according to the second aspect, each of the first transistor and the second transistor may be an NPN-type transistor and include an emitter, a collector, and a base. The first terminal of the first transistor and the first terminal of the second transistor may be the emitter of the first transistor and the emitter of the second transistor, respectively. The second terminal of the first transistor and the second terminal of the second transistor may be the collector of the first transistor and the collector of the second transistor, respectively. The control terminal of the first transistor and the control terminal of the second transistor may be the base of the first transistor and the base of the second transistor, respectively.

A self-oscillation circuit according to a third aspect of the present invention may include a bias power source, a sensor, a current-to-voltage conversion circuit, an amplitude detector, a second voltage source, an error integrator, an attenuator, and a buffer. The sensor may include an oscillator connected to the bias power source, a first electrode, and a second electrode. The current-to-voltage conversion circuit may be connected to the first electrode. The current-to-voltage conversion circuit may include a first resistor, a first current source, a first capacitor, a first output terminal, a first voltage source, a first transistor, and a second resistor. The first resistor may include a first end and a second end. The first end of the first resistor may be connected to the first electrode. The second end of the first resistor may be connected to a first electrical potential. The first capacitor may include a first end and a second end. The first end of the first capacitor may be connected to the first end of the first resistor. The second end of the first capacitor may be connected to the first current source. The first transistor may include a first terminal, a second terminal, and a control terminal. The first terminal may be connected to the second end of the first capacitor. The second terminal may be connected to the first output terminal. The control terminal may be connected to the first voltage source. The second resistor may include a first end and a second end. The first end of the second resistor may be connected to the second terminal. The second end of the second resistor may be connected to a second electrical potential. The amplitude detector may include an input and an output. The input of the amplitude detector may be connected to the first output terminal. The error integrator may include a first input, a second input, and an output. The first input of the error integrator may be connected to the output of the amplitude detector. The second input of the error integrator may be connected to the second voltage source. The attenuator may include a first input, a second input, and an output. The first input of the attenuator may be connected to the first output terminal. The second input of the attenuator may be connected to the output of the error integrator. The buffer may include an input and an output. The input of the buffer may be connected to the output of the attenuator. The output of the buffer may be connected to the second electrode.

In the above-stated self-oscillation circuit according to the third aspect, the first resistor may be configured to fix an electrical potential input from the sensor.

According to one aspect of the present invention, the reduction of the changes of the electrical potential of the output electrode included in the sensor and the reduction of the consumption current in the circuit are achieved.

DETAILED DESCRIPTION OF THE INVENTION

Hereinafter, several embodiments of the present invention will be described with reference to the drawings.

First Embodiment

Figure 1:
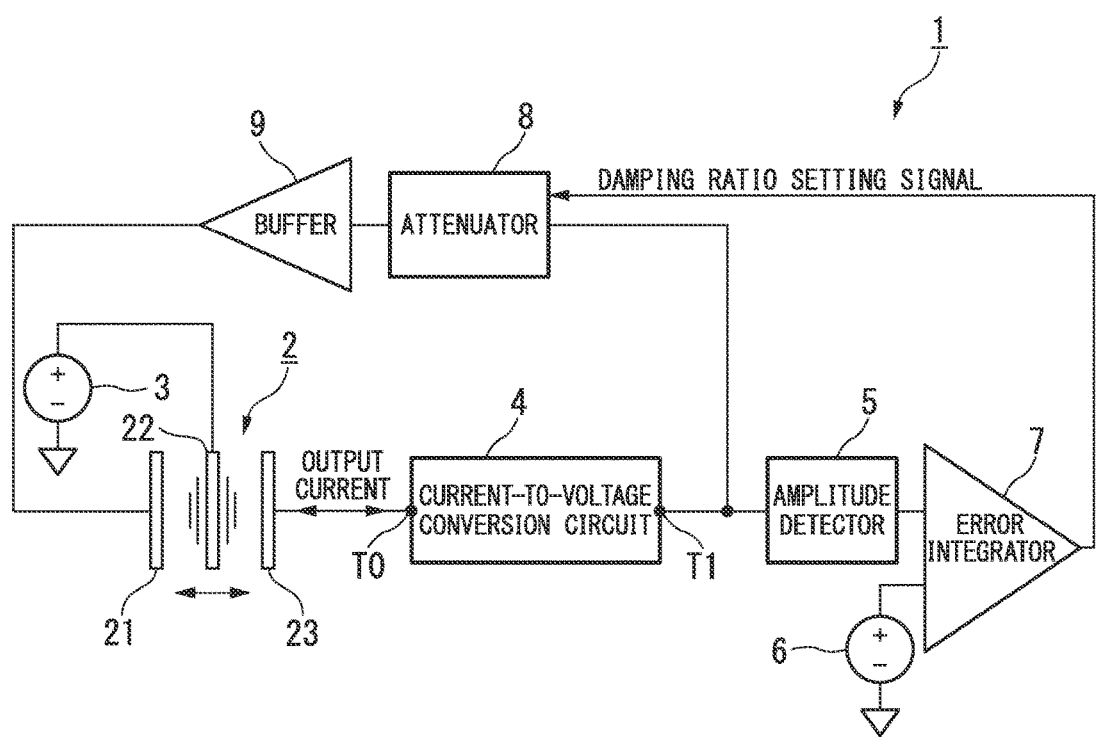
FIG. 1 is a block diagram schematically showing a self-oscillation circuit including a current-to-voltage conversion circuit according to a first embodiment.

FIG. 1 is a block diagram schematically showing a self-oscillation circuit 1 including a current-to-voltage conversion circuit according to the first embodiment.

As shown in FIG. 1, the self-oscillation circuit 1 includes an oscillation sensor 2, a bias power source 3, a current-to-voltage conversion circuit 4, an amplitude detector 5, a voltage source 6, an error integrator 7, an attenuator 8, and a buffer 9.

The oscillation sensor 2 includes a first fixed electrode 21 (input electrode), an oscillator 22, and a second fixed electrode 23 (output electrode). In the present invention, an electrode means at least one of the first fixed electrode 21 (input electrode), the oscillator 22, and the second fixed electrode 23 (output electrode). The buffer 9 inputs driving signals into the first fixed electrode 21. The bias power source 3 supplies a bias voltage to the oscillator 22. The second fixed electrode 23 inputs an output current into the current-to-voltage conversion circuit 4. The output current is an alternating current. When the oscillator 22 does not oscillate, the first fixed electrode 21 is separated from the oscillator 22 by a first interval and the oscillator 22 is separated from the second fixed electrode 23 by a second interval. Since the oscillator 22 oscillates based on the self-oscillation to change the second interval, the capacitance between the first fixed electrode 21 and the oscillator 22 is changed. Since the oscillation sensor 2 keeps the charges constant when the oscillator 22 oscillates, the second fixed electrode 23 included in the oscillation sensor 2 outputs the output current based on the changes of the capacitance.

The negative electrode of the bias power source 3 is grounded and the positive electrode is connected to the oscillator 22 included in the oscillation sensor 2. The bias power source 3 is a direct voltage power source.

The current-to-voltage conversion circuit 4 fixes the electrical potential of the output electrode included in the oscillation sensor 2 to a predetermined electrical potential. The current-to-voltage conversion circuit 4 converts the current, which has been input from the oscillation sensor 2, into a voltage and outputs the voltage to the amplitude detector 5 and the attenuator 8. The configuration of the current-to-voltage conversion circuit 4 will be described later.

The amplitude detector 5 detects the size of the amplitude of the voltage input from the current-to-voltage conversion circuit 4 and inputs a voltage, which indicates the detected amplitude size, into the error integrator 7.

The voltage source 6 is a direct voltage source. The negative electrode of the voltage source 6 is grounded and the positive electrode is connected to the error integrator 7. The voltage value of the voltage source 6 allows the oscillator 22 to oscillate without the collision of oscillator 22 with the first fixed electrode 21 and the second fixed electrode 23.

The error integrator 7 integrates errors between a first voltage input from the voltage source 6 and a second voltage input from the amplitude detector 5 and inputs the integrated signal into the attenuator 8 as a damping ratio setting signal.

The attenuator 8 damps the size of the amplitude of the voltage input from the current-to-voltage conversion circuit 4 based on the damping ratio setting signal and supplies the damped signal to the first fixed electrode 21 via the buffer 9. The adjustment of the size of the signal to be supplied to the first fixed electrode 21 using the attenuator 8 as described above is executed so as to prevent the oscillator 22 from colliding against the first fixed electrode 21 and the second fixed electrode 23.

The buffer 9 is a buffer circuit where the amplification factor is one.

As described above, the self-oscillation circuit 1 includes the current-to-voltage conversion circuit (4) having the input connected to one electrode (the first fixed electrode 21 or the second fixed electrode 23) included in the sensor (the oscillation sensor 2), the amplitude detector (5) having the input connected to the output of the current-to-voltage conversion circuit, the error integrator (7) having one input connected to the output of the amplitude detector and the other input connected to the voltage source, the attenuator (8) having one input connected to the output of the current-to-voltage conversion circuit and the other input connected to the output of the error integrator, and the buffer (9) having the input connected to the output of the attenuator and the output connected to the other electrode (the first fixed electrode 21 or the second fixed electrode 23) included in the sensor. The sensor includes an oscillator (22) connected to a bias power source.

According to this configuration, the self-oscillation circuit 1 continuously adjusts the damping ratio using the amplitude detector 5 and the error integrator 7, thereby the self-oscillation circuit 1 can keep the amplitude of the signal oscillated by the oscillation sensor 2 constant. In addition, according to this configuration, the current-to-voltage conversion circuit 4 can fix the electrical potential of the output electrode included in the oscillation sensor 2 to a predetermined electrical potential. Thereby, since the change of the electrical potential of the output electrode included in the oscillation sensor 2 can be reduced, the bias voltage of the oscillator 22 included in the oscillation sensor 2 is stabilized. Thereby, according to the self-oscillation circuit 1 of the first embodiment, the oscillation frequency obtained by the oscillation sensor 2 can be stabilized. As described above, the oscillation frequency can be stabilized. Therefore, when making the oscillation sensor 2 execute a self-oscillation and using the oscillation signal as a reference clock, the stability of the frequency of the reference clock can be improved.

Figure 2:
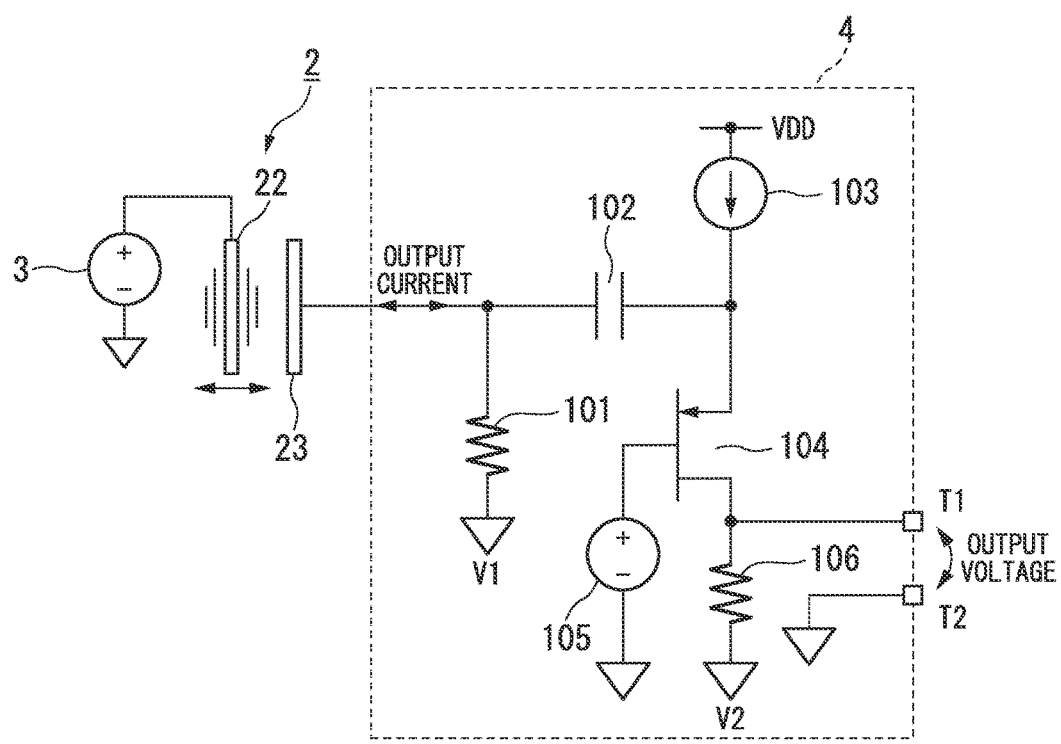
FIG. 2 is a circuit diagram showing a current-to-voltage conversion circuit using a PMOS transistor according to the first embodiment.

FIG. 2 is a circuit diagram showing the current-to-voltage conversion circuit 4 using a PMOS transistor according to the first embodiment.

As shown in FIG. 2, the current-to-voltage conversion circuit 4 includes a resistor 101 (first resistor), a capacitor 102 (first capacitor), a current source 103 (first current source), a transistor 104 (first transistor), a voltage source 105 (first voltage source), a resistor 106 (second resistor), a terminal T1, and a terminal T2. The second fixed electrode 23 included in the oscillation sensor 2 is connected to the current-to-voltage conversion circuit 4. In FIG. 2, the illustration of the first fixed electrode 21 included in the oscillation sensor 2 is omitted.

The resistor 101 has one end and the other end grounded. The one end of the resistor 101 is connected to the second fixed electrode 23 included in the oscillation sensor 2 and one end of the capacitor 102. The resistor 101 functions to fix the electrical potential input into the current-to-voltage conversion circuit 4. Therefore, the electrical potential (first electrical potential V1), to which the other end of the resistor 101 is connected, may be, for example, one of ground (0V), a positive source voltage (VDD), a negative source voltage (VEE), and a predetermined reference voltage (Vref). The positive source voltage (VDD) is, for example, 5V, the negative source voltage (VEE) is, for example, −5V, and the predetermined reference voltage (Vref) is, for example, 2.5V. The impedance of the resistor 101 is, for example, 1 MΩ. In the wiring pattern, the closer the negative electrode included in the bias power source 3 and the other end of the resistor 101, the less the influence of the noise and the influence of the change of the electrical potential.

The other end of the capacitor 102 is connected to the output end of the current source 103 and a source (first terminal) of the transistor 104. The capacitance of the capacitor 102 satisfies the following equation (1), for example, 0.1 μF. In the following equation, the "fc" is a resonance frequency of the resistor 101 and the capacitor 102.

$$1/(2\pi fc) << \text{impedance of resistor } 101[\Omega]$$

The current source 103 supplies an idling current for setting the transistor 104 to an ON state. The current source 103 is supplied with the electrical power from the positive source voltage (VDD). The impedance of the current source 103 is, for example, a few MΩ. The current value supplied from the current source 103 to the transistor 104 is, for example, 10 μA.

The transistor 104 is a P-type MOS transistor (PMOS). A gate (control terminal) of the transistor 104 is connected to the positive electrode of the voltage source 105 and a drain (second terminal) of the transistor 104 is connected to one end of the resistor 106 and the terminal T1. The impedance between a source of the transistor 104 and the drain is, for example, a few hundred kΩ. If the positive source voltage (VDD) is 5V, the electrical potential of the connection point of the other end of the capacitor 102 and the source is, for example, 3.5V and the electrical potential of the connection point of the drain, the one end of the resistor 106, and the terminal T1 is, for example, 2V (=10 μA (the current value supplied from the current source 103)*200 kΩ (the resistance value of the resistor 106)).

The other end of the resistor 106 is grounded (second electrical potential V2). The second electrical potential V2 may be the same as the first electrical potential V1 or may be different from the first electrical potential V1. The resistance value of the resistor 106 is, for example, 200 kΩ.

The terminal T2 is grounded. The voltage between the terminal T1 and the terminal T2 is the output voltage of the current-to-voltage conversion circuit 4.

Hereinafter, the operation of the current-to-voltage conversion circuit 4 will be described.

The output current output from the second fixed electrode 23 included in the oscillation sensor 2 flows through a path, which has the lowest impedance. As described above, since the impedance between the source and the drain of the transistor 104 is lower than each of the impedance of the resistor 101 and the impedance of the current source 103, almost all of the output current flows into the source of the transistor 104.

Since the gate is insulated, the current, which has flowed into the source, flows into the drain.

The current, which has flowed into the drain, is converted to a voltage by the resistor 106 connected to the drain.

As described above, the current-to-voltage conversion circuit (4) according to the first embodiment includes the first resistor (resistor 101) having one end connected to one electrode (second fixed electrode 23) included in the sensor (oscillation sensor 2) and the other end connected to the first electrical potential (V1), the first capacitor (capacitor 102) having one end connected to the one end of the first resistor and the other end connected to the first current source (current source 103), the first transistor (transistor 104) having the first terminal (source) connected to the other end of the first capacitor, the second terminal (drain) connected to the first output terminal (T1), and the control terminal (gate) connected to the first voltage source (voltage source 105), and the second resistor (resistor 106) having one end connected to the second terminal of the first transistor and the other end connected to the second electrical potential (V2).

In the current-to-voltage conversion circuit (4) according to the first embodiment, the voltage value of the second voltage is 0V, and the first transistor (transistor 104) is a P-type MOS transistor.

According to the current-to-voltage conversion circuit 4 of the first embodiment having this configuration, the main electrical potential of the output electrode included in the oscillation sensor 2 can be fixed to the first electrical potential V1 such as GND level using the resistor 101. Therefore, since the change of the electrical potential of the output electrode included in the oscillation sensor 2 can be reduced, the bias voltage of the oscillator 22 included in the oscillation sensor 2 is stabilized. Thereby, according to the current-to-voltage conversion circuit 4 of the first embodiment, the oscillation frequency obtained by the oscillation sensor 2 can be stabilized.

As described above, the oscillation frequency can be stabilized. Therefore, when making the oscillation sensor 2 execute the self-oscillation and using the oscillation signal as a reference clock, the stability of the frequency of the reference clock can be improved.

The driving current of the transistor 104 included in the current-to-voltage conversion circuit 4 is, for example, 10 μA. This driving current corresponds to the consumption current of the current-to-voltage conversion circuit 4.

On the other hand, if a current-to-voltage conversion is executed using an operation amplifier as described in the related art, the consumption current of the operation amplifier is about 200 μA. In other words, according to the current-to-voltage conversion circuit 4 of the first embodiment, the consumption current can be reduced to about twentieth part of the related art.

Second Embodiment

In the first embodiment, the configuration where the PMOS transistor is used in the current-to-voltage conversion circuit 4 was described. In the second embodiment, a configuration using an N-type MOS transistor will be described.

Figure 3:
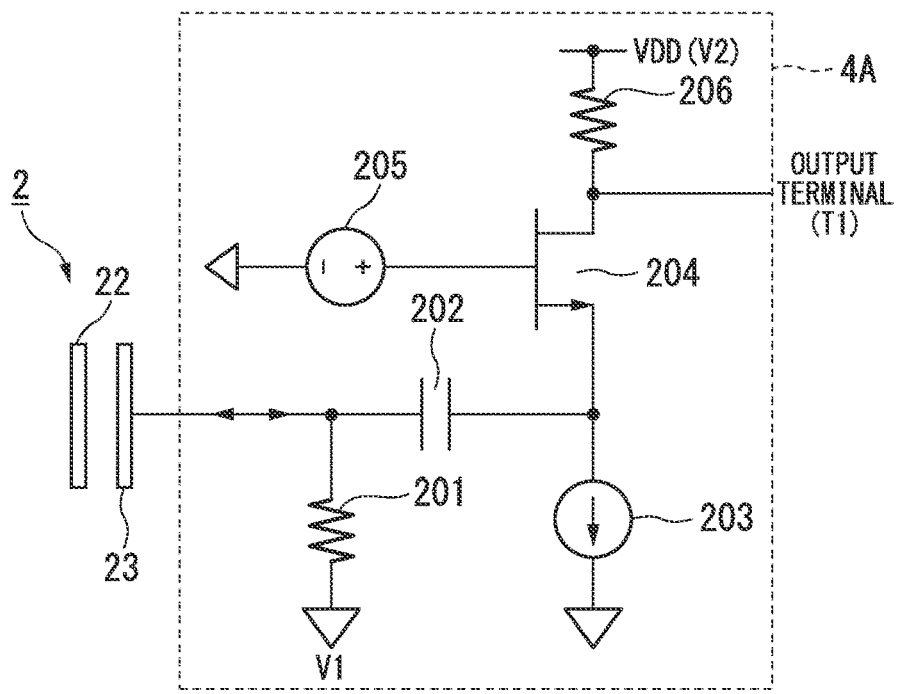
FIG. 3 is a circuit diagram showing a current-to-voltage conversion circuit using a NMOS transistor according to a second embodiment.

FIG. 3 is a circuit diagram showing a current-to-voltage conversion circuit 4A using an NMOS transistor according to the second embodiment.

As shown in FIG. 3, the current-to-voltage conversion circuit 4A includes a resistor 201 (first resistor), a capacitor 202 (first capacitor), a current source 203 (first current source), a transistor 204 (first transistor), a voltage source 205 (first voltage source), and a resistor 206 (second resistor). The second fixed electrode 23 included in the oscillation sensor 2 is connected to the current-to-voltage conversion circuit 4A. In FIG. 3, the illustration of the terminal T2 and the first fixed electrode 21 included in the oscillation sensor 2 is omitted.

The output voltage of the current-to-voltage conversion circuit 4A may be input into the amplitude detector 5 and the attenuator 8 so as to configure the current-to-voltage detection circuit (FIG. 1).

The resistor 201 corresponds to the resistor 101 (FIG. 2). The impedance of the resistor 201 is, for example, 1 MΩ. The resistor 201 functions to fix the electrical potential input into the current-to-voltage conversion circuit 4A similar to the resistor 101. The first electrical potential V1 of the other end of the resistor 201 may be, for example, one of ground (0V), a positive source voltage (VDD), a negative source voltage (VEE), and a predetermined reference voltage (Vref).

The capacitor 202 corresponds to the capacitor 102 (FIG. 2). The capacitance of the capacitor 202 is, for example, 0.1 μF. The other end of the capacitor 202 is connected to an input end of the current source 203 and a source (first terminal) of the transistor 204.

The current source 203 supplies an idling current for setting the transistor 204 to an ON state. The impedance of the current source 203 is, for example, a few MΩ. The current value supplied from the positive source voltage (VDD) to the transistor 204 via the resistor 206 using the current source 203 is, for example, 10 μA.

The transistor 204 is an N-type MOS transistor. A gate (control terminal) of the transistor 204 is connected to the positive electrode of the voltage source 205 and a drain (second terminal) of the transistor 204 is connected to one end of the resistor 206 and an output terminal. The impedance between a source of the transistor 204 and the drain is, for example, a few hundred kΩ.

The other end of the resistor 206 is connected to the positive source voltage (VDD), which is a second electrical potential V2. The resistance value of the resistor 206 is, for example, 200 kΩ. The second electrical potential V2, to which the other end of the resistor 206 is connected, may be an electrical potential of 4V or the like, which is different from the positive source voltage (VDD).

Next, the operation of the current-to-voltage conversion circuit 4A will be described.

Since the impedance between the source and the drain of the transistor 204 is lower than each of the impedance of the resistor 201 and the impedance of the current source 203, almost all of the output current flows into the source of the transistor 204.

Since the gate is insulated, the current, which has flowed into the source, flows into the drain.

The current, which has flowed into the drain, is converted to a voltage by the resistor 206 connected to the drain.

As described above, the current-to-voltage conversion circuit (4A) according to the second embodiment includes the first resistor (resistor 201) having one end connected to one electrode (second fixed electrode 23) included in the sensor (oscillation sensor 2) and the other end connected to the first electrical potential (V1), the first capacitor (capacitor 202) having one end connected to the one end of the first resistor and the other end connected to the first current source (current source 203), the first transistor (transistor 204) having the first terminal (source) connected to the other end of the first capacitor, the second terminal (drain) connected to the first output terminal (T1), and the control terminal (gate) connected to the first voltage source (voltage source 205), and the second resistor (resistor 206) having one end connected to the second terminal of the first transistor and the other end connected to the second electrical potential (V2).

In the current-to-voltage conversion circuit (4A) according to the second embodiment, the voltage value of the second voltage is the source voltage (VDD), and the first transistor (transistor 204) is an N-type MOS transistor.

According to the current-to-voltage conversion circuit 4A of the second embodiment having this configuration, similar to the first embodiment, the main electrical potential of the output electrode included in the oscillation sensor 2 can be fixed to the first electrical potential V1 such as GND level using the resistor 201. Thereby, according to the current-to-voltage conversion circuit 4A of the second embodiment, the oscillation frequency obtained by the oscillation sensor 2 can be stabilized.

The driving current of the transistor 204 included in the current-to-voltage conversion circuit 4A is, for example, 10 μA. Thereby, according to the current-to-voltage conversion circuit 4A of the second embodiment, the consumption current can be reduced to about twentieth part of the related art.

Third Embodiment

In the third embodiment, a current-to-voltage conversion circuit using a PNP transistor will be described.

Figure 4:
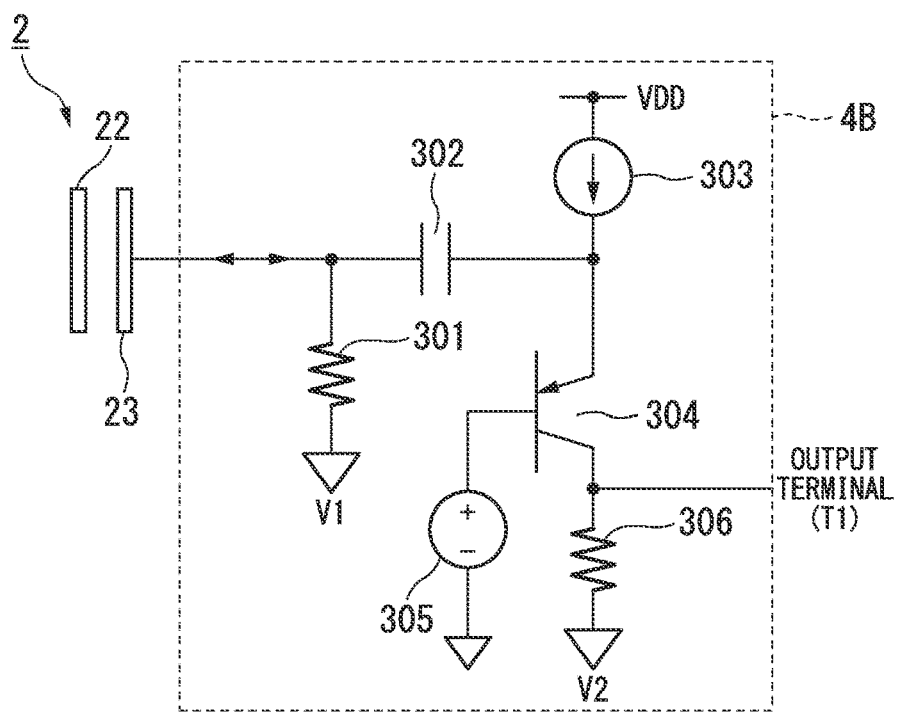
FIG. 4 is a circuit diagram showing a current-to-voltage conversion circuit using a PNP transistor according to a third embodiment.

FIG. 4 is a circuit diagram showing a current-to-voltage conversion circuit 4B using a PNP transistor according to the third embodiment.

As shown in FIG. 4, the current-to-voltage conversion circuit 4B includes a resistor 301 (first resistor), a capacitor 302 (first capacitor), a current source 303 (first current source), a transistor 304 (first transistor), a voltage source 305 (first voltage source), and a resistor 306 (second resistor). The second fixed electrode 23 included in the oscillation sensor 2 is connected to the current-to-voltage conversion circuit 4B. In FIG. 4, the illustration of the terminal T2 and the first fixed electrode 21 included in the oscillation sensor 2 is omitted.

The output voltage of the current-to-voltage conversion circuit 4B may be input into the amplitude detector 5 and the attenuator 8 so as to configure the current-to-voltage detection circuit (FIG. 1).

As shown in FIG. 4, the current-to-voltage conversion circuit 4B has the configuration where the transistor 104 of the current-to-voltage conversion circuit 4 (FIG. 2), which is a P-type MOS transistor, is replaced with the transistor 304, which is a PNP transistor. The resistor 301, the capacitor 302, the current source 303, the transistor 304, the voltage source 305 and the resistor 306 correspond to the resistor 101, the capacitor 102, the current source 103, the transistor 104, the voltage source 105 and the resistor 106 in the current-to-voltage conversion circuit 4, respectively. Therefore, hereinafter, the configuration, which is different from that of the current-to-voltage conversion circuit 4, will be described.

The other end of the capacitor 302 is connected to an output end of the current source 303 and an emitter (first terminal) of the transistor 304.

The transistor 304 is a PNP-type transistor (also referred to as a PNP transistor). A base (control terminal) of the transistor 304 is connected to the positive electrode of the voltage source 305 and a collector (second terminal) of the transistor 304 is connected to one end of the resistor 306 and an output terminal. The impedance between an emitter and the collector of the transistor 304 is, for example, a few hundred kΩ.

As described above, the current-to-voltage conversion circuit (4B) according to the third embodiment includes the first resistor (resistor 301) having one end connected to one electrode (second fixed electrode 23) included in the sensor (oscillation sensor 2) and the other end connected to the first electrical potential (V1), the first capacitor (capacitor 302) having one end connected to the one end of the first resistor and the other end connected to the first current source (current source 303), the first transistor (transistor 304) having the first terminal (emitter) connected to the other end of the first capacitor, the second terminal (collector) connected to the first output terminal (T1), and the control terminal (base) connected to the first voltage source (voltage source 305), and the second resistor (resistor 306) having one end connected to the second terminal of the first transistor and the other end connected to the second electrical potential (V2).

In the current-to-voltage conversion circuit (4B) according to the third embodiment, the voltage value of the second voltage is 0V, and the first transistor (transistor 304) is a PNP-type transistor.

According to the current-to-voltage conversion circuit 4B of the third embodiment having this configuration, similar to the first embodiment, the main electrical potential of the output electrode included in the oscillation sensor 2 can be fixed to the first electrical potential V1 such as GND level using the resistor 301. Thereby, according to the current-to-voltage conversion circuit 4B of the third embodiment, the oscillation frequency obtained by the oscillation sensor 2 can be stabilized.

The driving current of the transistor 304 included in the current-to-voltage conversion circuit 4B is, for example, 10 μA. Thereby, according to the current-to-voltage conversion circuit 4B of the third embodiment, the consumption current can be reduced to about twentieth part of the related art.

Fourth Embodiment

In the fourth embodiment, a current-to-voltage conversion circuit using an NPN-type transistor (also referred to as an NPN transistor) will be described.

Figure 5:
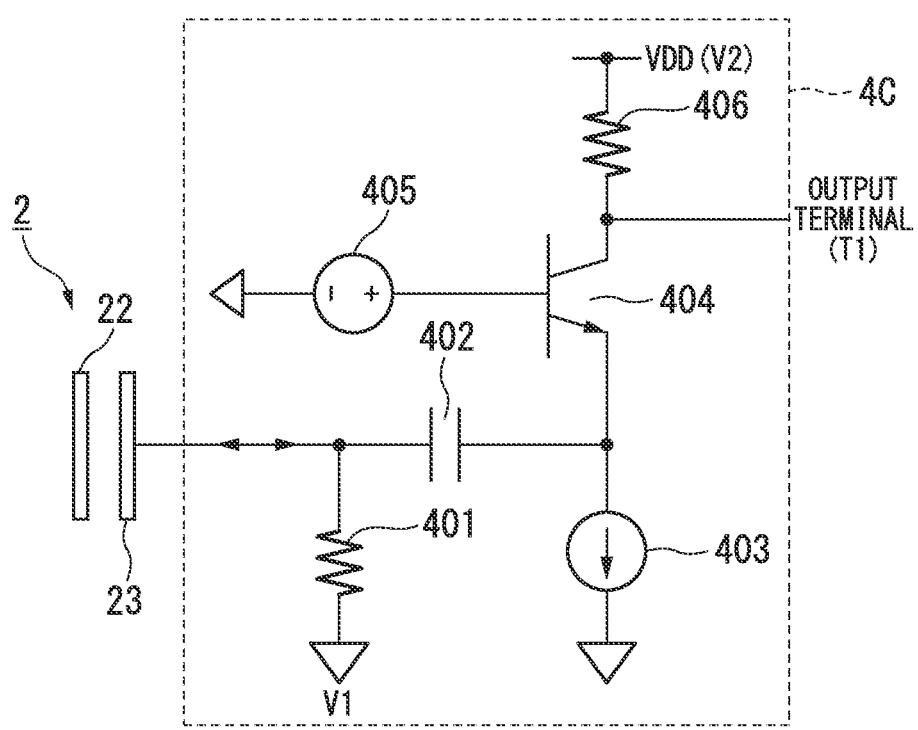
FIG. 5 is a circuit diagram showing a current-to-voltage conversion circuit using an NPN transistor according to a fourth embodiment.

FIG. 5 is a circuit diagram showing a current-to-voltage conversion circuit 4C using an NPN transistor according to the fourth embodiment.

As shown in FIG. 5, the current-to-voltage conversion circuit 4C includes a resistor 401 (first resistor), a capacitor 402 (first capacitor), a current source 403 (first current source), a transistor 404 (first transistor), a voltage source 405 (first voltage source), and a resistor 406 (second resistor). The second fixed electrode 23 included in the oscillation sensor 2 is connected to the current-to-voltage conversion circuit 4C. In FIG. 5, the illustration of the terminal T2 and the first fixed electrode 21 included in the oscillation sensor 2 is omitted.

The output voltage of the current-to-voltage conversion circuit 4C may be input into the amplitude detector 5 and the attenuator 8 so as to configure the current-to-voltage detection circuit (FIG. 1).

As shown in FIG. 5, the current-to-voltage conversion circuit 4C has the configuration where the transistor 204 of the current-to-voltage conversion circuit 4A (FIG. 3), which is an N-type MOS transistor, is replaced with the transistor 404, which is an NPN transistor. The resistor 401, the capacitor 402, the current source 403, the transistor 404, the voltage source 405 and the resistor 406 correspond to the resistor 201, the capacitor 202, the current source 203, the transistor 204, the voltage source 205 and the resistor 206 in the current-to-voltage conversion circuit 4A, respectively. Therefore, hereinafter, the configuration, which is different from that of the current-to-voltage conversion circuit 4A, will be described.

The other end of the capacitor 402 is connected to an input end of the current source 403 and an emitter (first terminal) of the transistor 404.

The transistor 404 is an NPN-type transistor. A base (control terminal) of the transistor 404 is connected to a positive electrode of the voltage source 405 and a collector (second terminal) of the transistor 404 is connected to one end of the resistor 406 and an output terminal. The impedance between an emitter of and the collector the transistor 404 is, for example, a few hundred kΩ.

As described above, the current-to-voltage conversion circuit (4C) according to the fourth embodiment includes the first resistor (resistor 401) having one end connected to one electrode (second fixed electrode 23) included in the sensor (oscillation sensor 2) and the other end connected to the first electrical potential (V1), the first capacitor (capacitor 402) having one end connected to the one end of the first resistor and the other end connected to the first current source (current source 403), the first transistor (transistor 404) having the first terminal (emitter) connected to the other end of the first capacitor, the second terminal (collector) connected to the first output terminal (T1), and the control terminal (base) connected to the first voltage source (voltage source 405), and the second resistor (resistor 406) having one end connected to the second terminal of the first transistor and the other end connected to the second electrical potential (V2).

In the current-to-voltage conversion circuit (4C) according to the fourth embodiment, the voltage value of the second voltage is a source voltage, and the first transistor (transistor 404) is an NPN-type transistor.

According to the current-to-voltage conversion circuit 4C of the fourth embodiment having this configuration, similar to the first embodiment, the main electrical potential of the output electrode included in the oscillation sensor 2 can be fixed to the first electrical potential V1 such as GND level using the resistor 401. Thereby, according to the current-to-voltage conversion circuit 4C of the fourth embodiment, the oscillation frequency obtained by the oscillation sensor 2 can be stabilized.

The driving current of the transistor 404 included in the current-to-voltage conversion circuit 4C is, for example, 10 μA. Thereby, according to the current-to-voltage conversion circuit 4C of the fourth embodiment, the consumption current can be reduced to about twentieth part of the related art.

Fifth Embodiment

In the first to fourth embodiments, the configuration where the output current is obtained from the second fixed electrode 23 was described. In the fifth embodiment, a configuration where the output current is obtained from, not only the second fixed electrode 23, but also the first fixed electrode 21, and the output current is subjected to the current-to-voltage conversion will be described.

Figure 6:
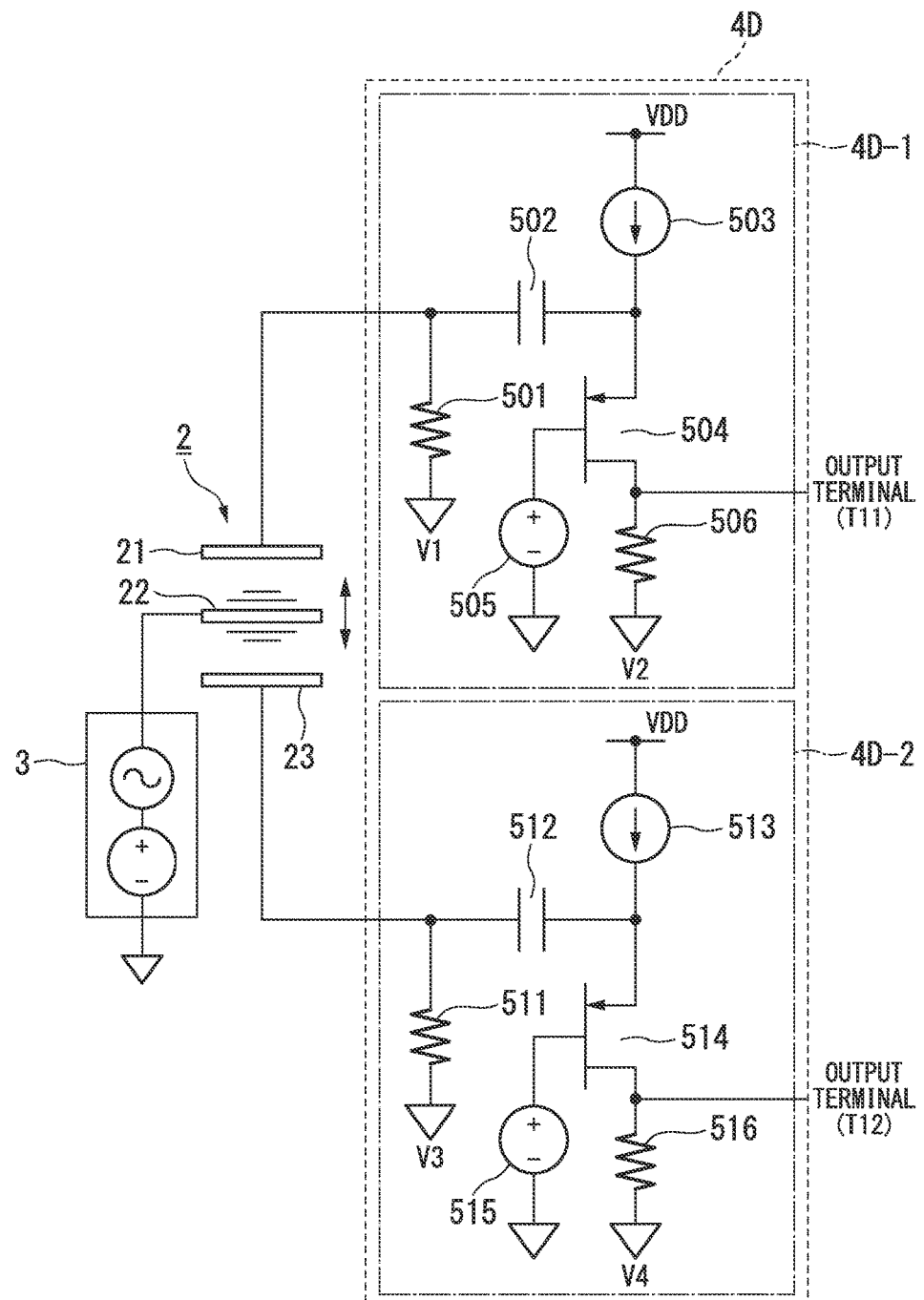
FIG. 6 is a circuit diagram showing a dual system current-to-voltage conversion circuit using PMOS transistors according to a fifth embodiment.

FIG. 6 is a circuit diagram showing a dual system current-to-voltage conversion circuit 4D using PMOS transistors according to the fifth embodiment.

As shown in FIG. 6, the current-to-voltage conversion circuit 4D includes a first current-to-voltage conversion circuit 4D-1 and a second current-to-voltage conversion circuit 4D-2. The first current-to-voltage conversion circuit 4D-1 includes an output terminal T11. The second current-to-voltage conversion circuit 4D-2 includes an output terminal T12.

As shown in FIG. 6, a bias power source 3 is connected to an oscillator 22 included in an oscillation sensor 2. The bias power source 3 is an alternating-current source.

The first current-to-voltage conversion circuit 4D-1 includes a resistor 501 (first resistor), a capacitor 502 (first capacitor), a current source 503 (first current source), a transistor 504 (first transistor), a voltage source 505 (first voltage source), and a resistor 506 (second resistor). A first fixed electrode 21 included in the oscillation sensor 2 is connected to the first current-to-voltage conversion circuit 4D-1.

The second current-to-voltage conversion circuit 4D-2 includes a resistor 511 (third resistor), a capacitor 512 (second capacitor), a current source 513 (second current source), a transistor 514 (second transistor), a voltage source 515 (second voltage source), and a resistor 516 (fourth resistor). A second fixed electrode 23 included in the oscillation sensor 2 is connected to the second current-to-voltage conversion circuit 4D-2.

Each configuration of the first current-to-voltage conversion circuit 4D-1 and the second current-to-voltage conversion circuit 4D-2 is the same as that of the current-to-voltage conversion circuit 4 described in the first embodiment.

In other words, the resistor 501, the capacitor 502, the current source 503, the transistor 504, the voltage source 505 and the resistor 506 correspond to the resistor 101, the capacitor 102, the current source 103, the transistor 104, the voltage source 105 and the resistor 106 in the current-to-voltage conversion circuit 4, respectively. The resistor 511, the capacitor 512, the current source 513, the transistor 514, the voltage source 515 and the resistor 516 correspond to the resistor 101, the capacitor 102, the current source 103, the transistor 104, the voltage source 105 and the resistor 106 in the current-to-voltage conversion circuit 4, respectively.

As long as the first electrical potential V1 of the other end of the resistor 501 and the third electrical potential V3 of the other end of the resistor 511 are the same as each other, the first electrical potential V1 and the third electrical potential V3 may be grounded, or may be connected to, for example, one of a positive source voltage (VDD), a negative source voltage (VEE), and a reference voltage (Vref).

As long as the second electrical potential V2 of the other end of the resistor 506 and the fourth electrical potential V4 of the other end of the resistor 516 are the same as each other, the second electrical potential V2 and the fourth electrical potential V4 may be grounded, or may be another electrical potential.

As described above, the current-to-voltage conversion circuit (4D) according to the fifth embodiment includes the first resistor (resistor 501) having one end connected to one electrode (first fixed electrode 21) included in the sensor (oscillation sensor 2) and the other end connected to the first electrical potential (V1), the first capacitor (capacitor 502) having one end connected to the one end of the first resistor and the other end connected to the first current source (current source 503), the first transistor (transistor 504) having the first terminal (source) connected to the other end of the first capacitor, the second terminal (drain) connected to the first output terminal (T11), and the control terminal (gate) connected to the first voltage source (voltage source 505), the second resistor (resistor 506) having one end connected to the second terminal of the first transistor and the other end connected to the second electrical potential (V2), the third resistor (resistor 511) having one end connected to the other electrode (second fixed electrode 23) included in the sensor and the other end connected to the third electrical potential (V3), the second capacitor (capacitor 512) having one end connected to the one end of the third resistor and the other end connected to the second current source (current source 513), the second transistor (transistor 514) having the first terminal (source) connected to the other end of the second capacitor, the second terminal (drain) connected to the second output terminal (T12), and the control terminal (gate) connected to the second voltage source (voltage source 515), and the fourth resistor (resistor 516) having one end connected to the second terminal of the second transistor and the other end connected to the fourth electrical potential (V4).

In the current-to-voltage conversion circuit (4D) according to the fifth embodiment, each of the voltage value of the second voltage and the voltage value of the third voltage is 0V, and each of the first transistor (transistor 504) and the second transistor (transistor 514) is a P-type MOS transistor.

According to the current-to-voltage conversion circuit 4D of the fifth embodiment having this configuration, the first main electrical potential of the first output electrode included in the oscillation sensor 2 can be fixed to the first electrical potential V1 such as GND level using the resistor 501 and the second main electrical potential of the second output electrode included in the oscillation sensor 2 can be fixed to the third electrical potential V3 such as GND level by using the resistor 511. Thereby, according to the current-to-voltage conversion circuit 4D of the fifth embodiment, the oscillation frequency obtained by the oscillation sensor 2 can be stabilized. According to the fifth embodiment, the output current can be obtained from both the first current-to-voltage conversion circuit 4D-1 and the second current-to-voltage conversion circuit 4D-2.

By adding the first output current obtained from the first current-to-voltage conversion circuit 4D-1 and the second output current obtained from the second current-to-voltage conversion circuit 4D-2 using an unshown adder, the amplitude of the output voltage in the fifth embodiment is twice as large as that of the current-to-voltage conversion circuit 4. Therefore, since the signal level can be enlarged, the fifth embodiment has the effect of improving the SN ratio in addition to the effects of the first embodiment.

In the fifth embodiment, the configuration where the first fixed electrode 21 is connected to the first current-to-voltage conversion circuit 4D-1 and the second fixed electrode 23 is connected to the second current-to-voltage conversion circuit 4D-2 was described, but the present invention is not limited to this configuration. The second fixed electrode 23 may be connected to the first current-to-voltage conversion circuit 4D-1 and the first fixed electrode 21 may be connected to the second current-to-voltage conversion circuit 4D-2.

Sixth Embodiment

In the fifth embodiment, the configuration including two types of the current-to-voltage conversion circuits 4 (FIG. 2) described in the first embodiment was described. In the sixth embodiment, a configuration including two types of the current-to-voltage conversion circuits 4B (FIG. 4) described in the third embodiment will be described.

Figure 7:
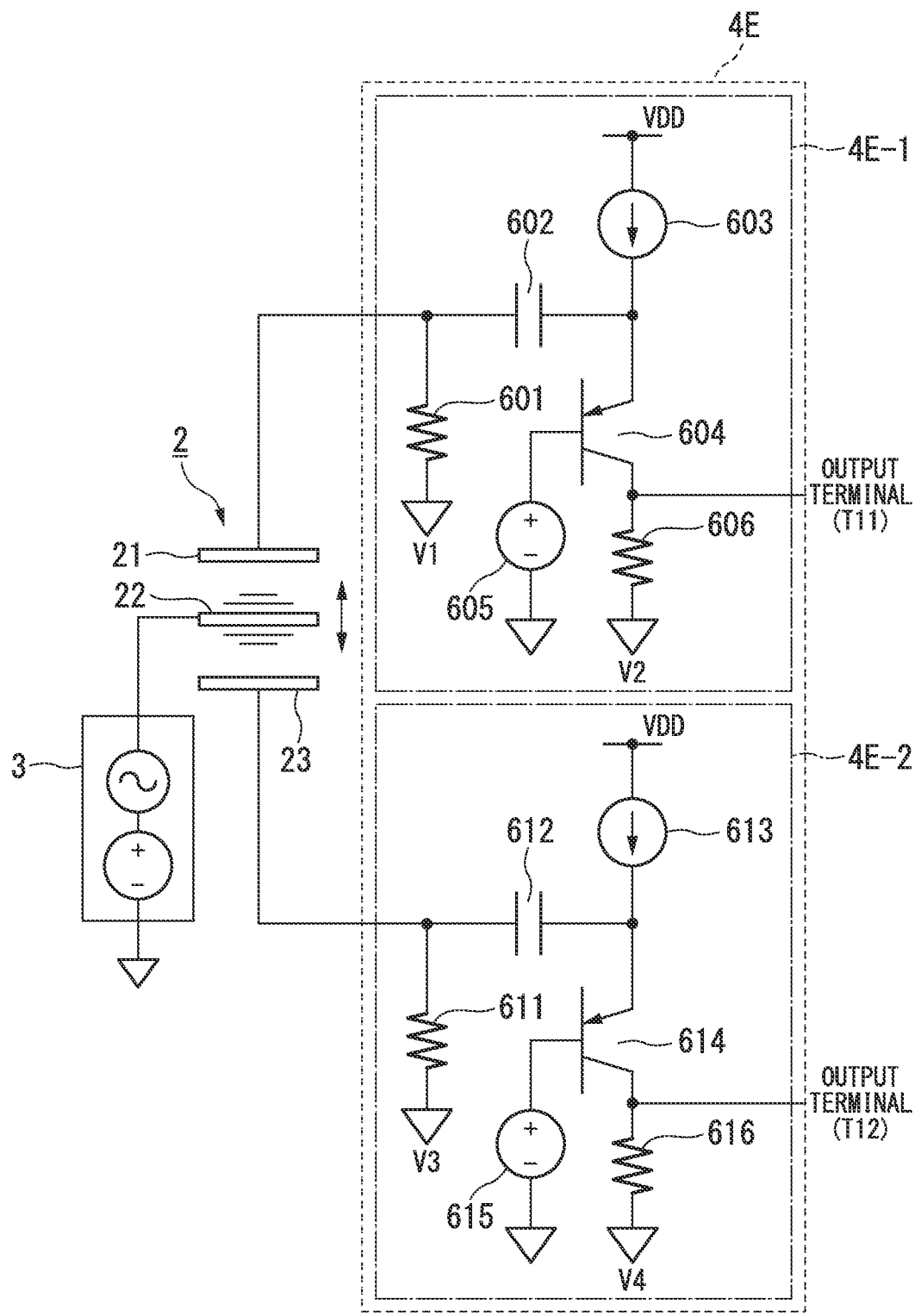
FIG. 7 is a circuit diagram showing a dual system current-to-voltage conversion circuit using PNP transistors according to a sixth embodiment.

FIG. 7 is a circuit diagram showing a dual system current-to-voltage conversion circuit 4E using PNP transistors according to the sixth embodiment.

As shown in FIG. 7, the current-to-voltage conversion circuit 4E includes a first current-to-voltage conversion circuit 4E-1 and a second current-to-voltage conversion circuit 4E-2.

As shown in FIG. 7, a bias power source 3 is connected to an oscillator 22 included in an oscillation sensor 2. The bias power source 3 is an alternating-current source. The first current-to-voltage conversion circuit 4E-1 includes an output terminal T11. The second current-to-voltage conversion circuit 4E-2 includes an output terminal T12.

A first fixed electrode 21 included in the oscillation sensor 2 is connected to the first current-to-voltage conversion circuit 4E-1. The first current-to-voltage conversion circuit 4E-1 has a configuration where the PMOS transistor 504 in the first current-to-voltage conversion circuit 4D-1 (FIG. 6) is replaced with a transistor 604, which is a PNP transistor.

A second fixed electrode 23 included in the oscillation sensor 2 is connected to the second current-to-voltage conversion circuit 4E-2. The second current-to-voltage conversion circuit 4E-2 has a configuration where the PMOS transistor 514 in the second current-to-voltage conversion circuit 4D-2 (FIG. 6) is replaced with a transistor 614, which is a PNP transistor.

As described above, the current-to-voltage conversion circuit (4E) according to the sixth embodiment includes the first resistor (resistor 601) having one end connected to one electrode (first fixed electrode 21) included in the sensor (oscillation sensor 2) and the other end connected to the first electrical potential (V1), the first capacitor (capacitor 602) having one end connected to the one end of the first resistor and the other end connected to the first current source (current source 603), the first transistor (transistor 604) having the first terminal (emitter) connected to the other end of the first capacitor, the second terminal (collector) connected to the first output terminal (T11), and the control terminal (base) connected to the first voltage source (voltage source 605), the second resistor (resistor 606) having one end connected to the second terminal of the first transistor and the other end connected to the second electrical potential (V2), the third resistor (resistor 611) having one end connected to the other electrode (second fixed electrode 23) included in the sensor and the other end connected to the third electrical potential (V3), the second capacitor (capacitor 612) having one end connected to the one end of the third resistor and the other end connected to the second current source (current source 613), the second transistor (transistor 614) having the first terminal (emitter) connected to the other end of the second capacitor, the second terminal (collector) connected to the second output terminal (T12), and the control terminal (base) connected to the second voltage source (voltage source 615), and the fourth resistor (resistor 616) having one end connected to the second terminal of the second transistor and the other end connected to the fourth electrical potential (V4).

In the current-to-voltage conversion circuit (4E) according to the sixth embodiment, each of the voltage value of the second voltage and the voltage value of the third voltage is 0V, and each of the first transistor (transistor 604) and the second transistor (transistor 614) is a PNP-type transistor.

According to the current-to-voltage conversion circuit 4E of the sixth embodiment having this configuration, the first main electrical potential of the first output electrode included in the oscillation sensor 2 can be fixed to the first electrical potential V1 such as GND level using the resistor 601 and the second main electrical potential of the second output electrode included in the oscillation sensor 2 can be fixed to the third electrical potential V3 such as GND level using the resistor 611. Thereby, according to the current-to-voltage conversion circuit 4E of the sixth embodiment, the oscillation frequency obtained by the oscillation sensor 2 can be stabilized. According to the sixth embodiment, the output current can be obtained from both the first current-to-voltage conversion circuit 4E-1 and the second current-to-voltage conversion circuit 4E-2.

By adding the first output current obtained from the first current-to-voltage conversion circuit 4E-1 and the second output current obtained from the second current-to-voltage conversion circuit 4E-2 using an unshown adder, the amplitude of the output voltage in the sixth embodiment is twice as large as that of the current-to-voltage conversion circuit 4B. Therefore, since the signal level can be enlarged, the sixth embodiment has the effect of improving the SN ratio in addition to the effects of the third embodiment.

Seventh Embodiment

In the fifth embodiment, the configuration including two types of the current-to-voltage conversion circuits 4 (FIG. 2) described in the first embodiment was described. In the seventh embodiment, a configuration including two types of the current-to-voltage conversion circuits 4A (FIG. 3) described in the second embodiment will be described.

Figure 8:
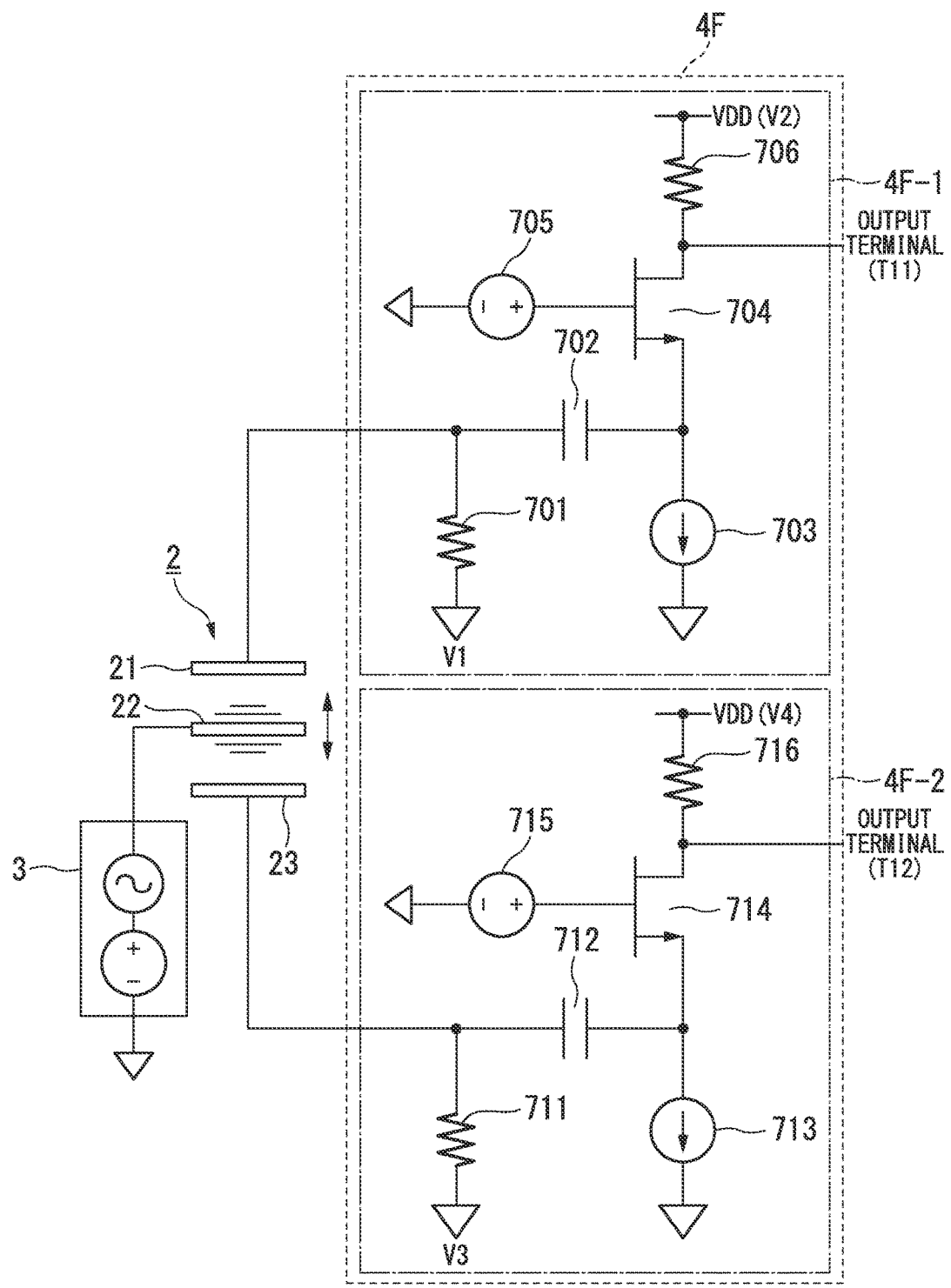
FIG. 8 is a circuit diagram showing a dual system current-to-voltage conversion circuit using NOMS transistors according to a seventh embodiment.

FIG. 8 is a circuit diagram showing a dual system current-to-voltage conversion circuit 4F using NMOS transistors according to the seventh embodiment.

As shown in FIG. 8, the current-to-voltage conversion circuit 4F includes a first current-to-voltage conversion circuit 4F-1 and a second current-to-voltage conversion circuit 4F-2.

As shown in FIG. 8, a bias power source 3 is connected to an oscillator 22 included in an oscillation sensor 2. The bias power source 3 is an alternating-current source. The first current-to-voltage conversion circuit 4F-1 includes an output terminal T11. The second current-to-voltage conversion circuit 4F-2 includes an output terminal T12.

A first fixed electrode 21 included in the oscillation sensor 2 is connected to the first current-to-voltage conversion circuit 4F-1. The first current-to-voltage conversion circuit 4F-1 has a configuration where the transistor 504, which is a P-type MOS transistor, in the first current-to-voltage conversion circuit 4D-1 (FIG. 6) is replaced with a transistor 704, which is an N-type MOS transistor.

A second fixed electrode 23 included in the oscillation sensor 2 is connected to the second current-to-voltage conversion circuit 4F-2. The second current-to-voltage conversion circuit 4F-2 has a configuration where the PMOS transistor 514 in the second current-to-voltage conversion circuit 4D-2 (FIG. 6) is replaced with a transistor 714, which is an NMOS transistor.

As described above, the current-to-voltage conversion circuit (4F) according to the seventh embodiment includes the first resistor (resistor 701) having one end connected to one electrode (first fixed electrode 21) included in the sensor (oscillation sensor 2) and the other end connected to the first electrical potential (V1), the first capacitor (capacitor 702) having one end connected to the one end of the first resistor and the other end connected to the first current source (current source 703), the first transistor (transistor 704) having the first terminal (source) connected to the other end of the first capacitor, the second terminal (drain) connected to the first output terminal (T11), and the control terminal (gate) connected to the first voltage source (voltage source 705), the second resistor (resistor 706) having one end connected to the second terminal of the first transistor and the other end connected to the second electrical potential (V2), the third resistor (resistor 711) having one end connected to the other electrode (second fixed electrode 23) included in the sensor and the other end connected to the third electrical potential (V3), the second capacitor (capacitor 712) having one end connected to the one end of the third resistor and the other end connected to the second current source (current source 713), the second transistor (transistor 714) having the first terminal (source) connected to the other end of the second capacitor, the second terminal (drain) connected to the second output terminal (T12), and the control terminal (gate) connected to the second voltage source (voltage source 715), and the fourth resistor (resistor 716) having one end connected to the second terminal of the second transistor and the other end connected to the fourth electrical potential (V4).

In the current-to-voltage conversion circuit (4F) according to the seventh embodiment, each of the voltage value of the second voltage and the voltage value of the fourth voltage is a voltage value of the source voltage (VDD), and each of the first transistor (transistor 704) and the second transistor (transistor 714) is an N-type MOS transistor.

According to the current-to-voltage conversion circuit 4F of the seventh embodiment having this configuration, the first main electrical potential of the first output electrode included in the oscillation sensor 2 can be fixed to the first electrical potential V1 such as GND level using the resistor 701 and the second main electrical potential of the second output electrode included in the oscillation sensor 2 can be fixed to the third electrical potential V3 such as GND level using the resistor 711. Thereby, according to the current-to-voltage conversion circuit 4F of the seventh embodiment, the oscillation frequency obtained by the oscillation sensor 2 can be stabilized. According to the seventh embodiment, the output current can be obtained from both the first current-to-voltage conversion circuit 4F-1 and the second current-to-voltage conversion circuit 4F-2.

By adding the first output current obtained from the first current-to-voltage conversion circuit 4F-1 and the second output current obtained from the second current-to-voltage conversion circuit 4F-2 using an unshown adder, the amplitude of the output voltage in the seventh embodiment is twice as large as that of the current-to-voltage conversion circuit 4A. Therefore, since the signal level can be enlarged, the seventh embodiment has the effect of improving the SN ratio in addition to the effects of the second embodiment.

Eighth Embodiment

In the fifth embodiment, the configuration including two types of the current-to-voltage conversion circuits 4 (FIG. 2) described in the first embodiment was described. In the eighth embodiment, a configuration including two types of the current-to-voltage conversion circuits 4C (FIG. 5) described in the fourth embodiment will be described.

Figure 9:
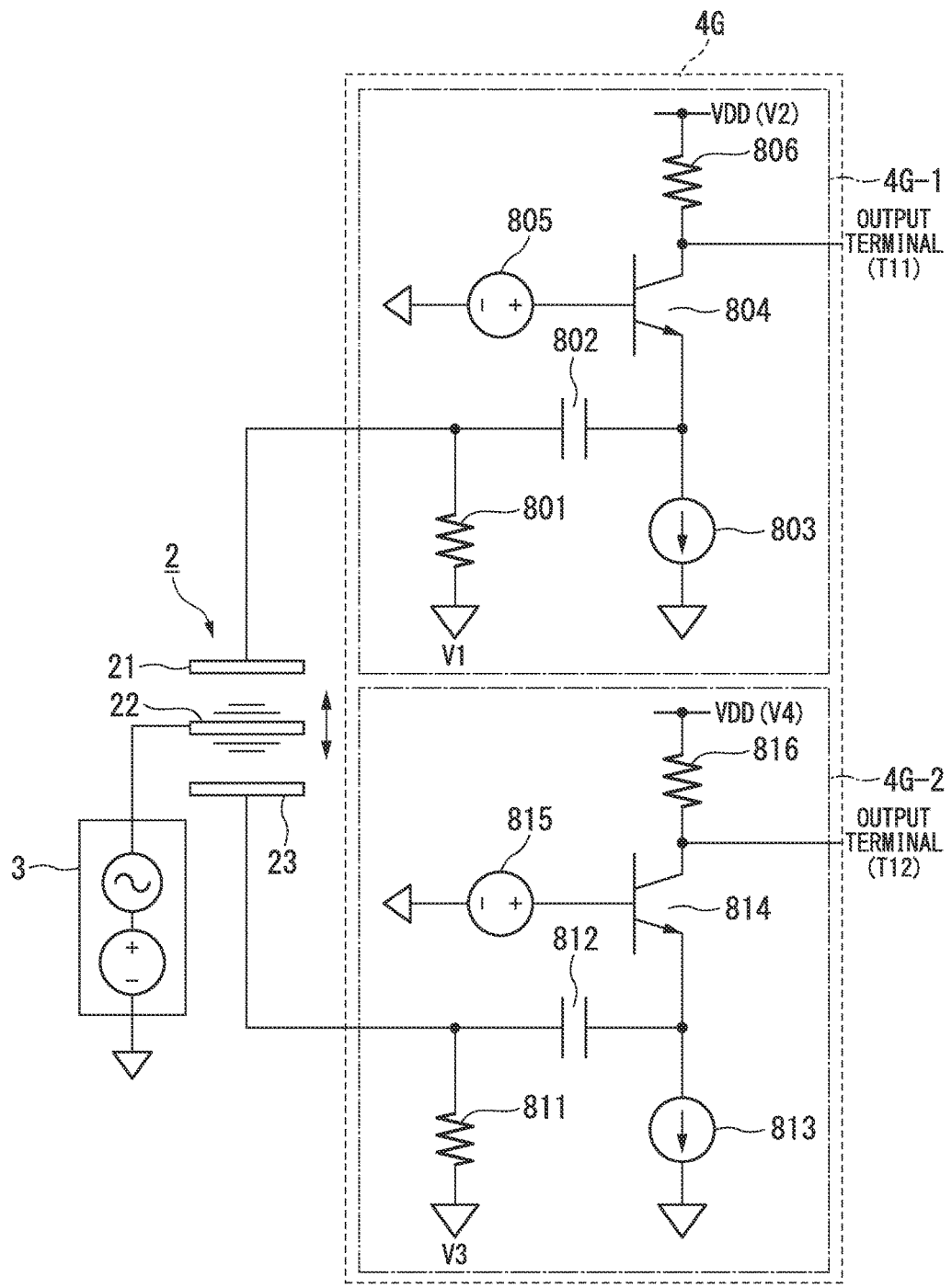
FIG. 9 is a circuit diagram showing a dual system current-to-voltage conversion circuit using NPN transistors according to an eight embodiment.

FIG. 9 is a circuit diagram showing a dual system current-to-voltage conversion circuit 4G using NPN transistors according to the eighth embodiment.

As shown in FIG. 9, the current-to-voltage conversion circuit 4G includes a first current-to-voltage conversion circuit 4G-1 and a second current-to-voltage conversion circuit 4G-2.

As shown in FIG. 9, a bias power source 3 is connected to an oscillator 22 included in an oscillation sensor 2. The bias power source 3 is an alternating-current source. The first current-to-voltage conversion circuit 4G-1 includes an output terminal T11. The second current-to-voltage conversion circuit 4G-2 includes an output terminal T12.

A first fixed electrode 21 included in the oscillation sensor 2 is connected to the first current-to-voltage conversion circuit 4G-1. The first current-to-voltage conversion circuit 4G-1 has a configuration where the transistor 504, which is a P-type MOS transistor, in the first current-to-voltage conversion circuit 4D-1 (FIG. 6) is replaced with a transistor 804, which is an NPN transistor.

A second fixed electrode 23 included in the oscillation sensor 2 is connected to the second current-to-voltage conversion circuit 4G-2. The second current-to-voltage conversion circuit 4G-2 has a configuration where the transistor 514, which is a P-type MOS transistor, in the second current-to-voltage conversion circuit 4D-2 (FIG. 6) is replaced with a transistor 814, which is an NPN transistor.

As described above, the current-to-voltage conversion circuit (4G) according to the eighth embodiment includes the first resistor (resistor 801) having one end connected to one electrode (first fixed electrode 21) included in the sensor (oscillation sensor 2) and the other end connected to the first electrical potential (V1), the first capacitor (capacitor 802) having one end connected to the one end of the first resistor and the other end connected to the first current source (current source 803), the first transistor (transistor 804) having the first terminal (emitter) connected to the other end of the first capacitor, the second terminal (collector) connected to the first output terminal (T11), and the control terminal (base) connected to the first voltage source (voltage source 805), the second resistor (resistor 806) having one end connected to the second terminal of the first transistor and the other end connected to the second electrical potential (V2), the third resistor (resistor 811) having one end connected to the other electrode (second fixed electrode 23) included in the sensor and the other end connected to the third electrical potential (V3), the second capacitor (capacitor 812) having one end connected to the one end of the third resistor and the other end connected to the second current source (current source 813), the second transistor (transistor 814) having the first terminal (emitter) connected to the other end of the second capacitor, the second terminal (collector) connected to the second output terminal (T12), and the control terminal (base) connected to the second voltage source (voltage source 815), and the fourth resistor (resistor 816) having one end connected to the second terminal of the second transistor and the other end connected to the fourth electrical potential (V4).

In the current-to-voltage conversion circuit (4G) according to the eighth embodiment, each of the voltage value of the second voltage and the voltage value of the fourth voltage is a voltage value of a source voltage (VDD), and each of the first transistor (transistor 804) and the second transistor (transistor 814) is an NPN-type transistor.

According to the current-to-voltage conversion circuit 4G of the eighth embodiment having this configuration, the first main electrical potential of the first output electrode included in the oscillation sensor 2 can be fixed to the first electrical potential V1 such as GND level using the resistor 801 and the second main electrical potential of the second output electrode included in the oscillation sensor 2 can be fixed to the third electrical potential V3 such as GND level using the resistor 811. Thereby, according to the current-to-voltage conversion circuit 4G of the eighth embodiment, the oscillation frequency obtained by the oscillation sensor 2 can be stabilized. According to the eighth embodiment, the output current can be obtained from both the first current-to-voltage conversion circuit 4G-1 and the second current-to-voltage conversion circuit 4G-2.

By adding the first output current obtained from the first current-to-voltage conversion circuit 4G-1 and the second output current obtained from the second current-to-voltage conversion circuit 4G-2 using an unshown adder, the amplitude of the output voltage in the eighth embodiment is twice as large as that of the current-to-voltage conversion circuit 4C. Therefore, since the signal level can be enlarged, the eighth embodiment has the effect of improving the SN ratio in addition to the effects of the fourth embodiment.

Ninth Embodiment

In the first to fourth embodiments, the configuration where the output voltage is obtained from the second fixed electrode 23 was described. In the ninth embodiment, a configuration where an output current is obtained from the oscillator 22 and the output current is subjected to a current-to-voltage conversion process will be described.

Figure 10:
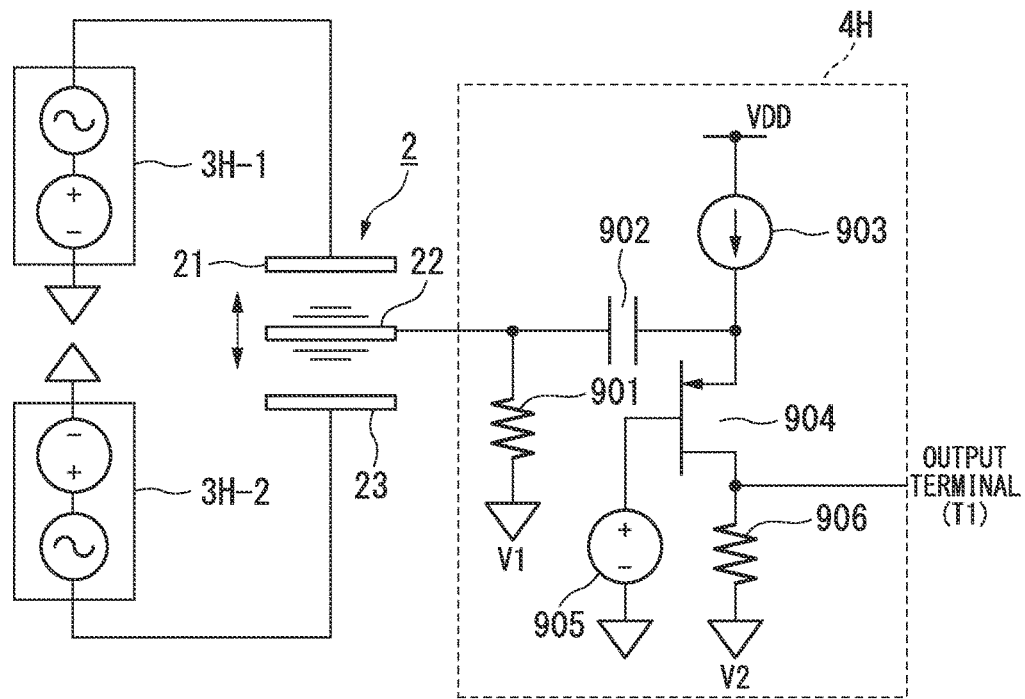
FIG. 10 is a circuit diagram showing a current-to-voltage conversion circuit using a PMOS transistor according to a ninth embodiment.

FIG. 10 is a circuit diagram showing a current-to-voltage conversion circuit 4H using a PMOS transistor according to the ninth embodiment.

As shown in FIG. 10, a bias power source 3H-1 is connected to a first fixed electrode 21 included in an oscillation sensor 2, the current-to-voltage conversion circuit 4H is connected to an oscillator 22, and a bias power source 3H-2 is connected to a second fixed electrode 23. Each of the bias power source 3H-1 and the bias power source 3H-2 is an alternating-current source.

The current-to-voltage conversion circuit 4H has the same configuration as that of the current-to-voltage conversion circuit 4 (FIG. 2).

As described above, the current-to-voltage conversion circuit (4H) according to the ninth embodiment includes the first resistor (resistor 901) having one end connected to one electrode (oscillator 22) included in the sensor (oscillation sensor 2) and the other end connected to the first electrical potential (V1), the first capacitor (capacitor 902) having one end connected to the one end of the first resistor and the other end connected to the first current source (current source 903), the first transistor (transistor 904) having the first terminal (source) connected to the other end of the first capacitor, the second terminal (drain) connected to the first output terminal (T1), and the control terminal (gate) connected to the first voltage source (voltage source 905), and the second resistor (resistor 906) having one end connected to the second terminal of the first transistor and the other end connected to the second electrical potential (V2).

In the current-to-voltage conversion circuit (4H) according to the ninth embodiment, the voltage value of the second voltage is 0V, and the first transistor (transistor 904) is a P-type MOS transistor.

In this configuration, similar to the current-to-voltage conversion circuit 4 according the first embodiment, the main electrical potential of the oscillator 22 included in the oscillation sensor 2 can be fixed to the first electrical potential V1 such as GND level using the resistor 901. Thereby, according to the current-to-voltage conversion circuit 4H of the ninth embodiment, the oscillation frequency obtained by the oscillation sensor 2 can be stabilized.

As shown in FIG. 10, by connecting the current-to-voltage conversion circuit 4H to the oscillator 22 and detecting the output current of the oscillator 22, the changes of oscillation, temperature, magnetic field, and the like can be detected.

Tenth Embodiment

In the ninth embodiment, the current-to-voltage conversion circuit including the PMOS transistor was described. In the tenth embodiment, a current-to-voltage conversion circuit including a PNP transistor will be described.

Figure 11:
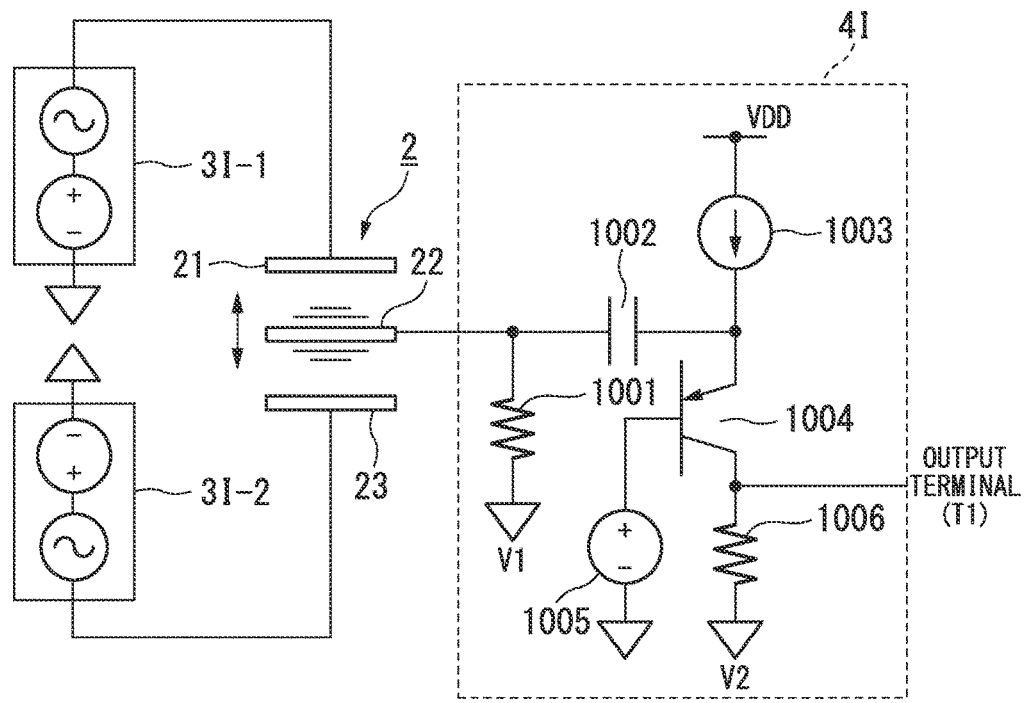
FIG. 11 is a circuit diagram showing a current-to-voltage conversion circuit using a PNP transistor according to a tenth embodiment.

FIG. 11 is a circuit diagram showing a current-to-voltage conversion circuit 4I using a PNP transistor according to the tenth embodiment.

As shown in FIG. 11, a bias power source 3I-1 is connected to a first fixed electrode 21 included in an oscillation sensor 2, the current-to-voltage conversion circuit 4I is connected to an oscillator 22, and a bias power source 3I-2 is connected to a second fixed electrode 23. Each of the bias power source 3I-1 and the bias power source 3I-2 is an alternating-current source.

The current-to-voltage conversion circuit 4I has the same configuration as that of the current-to-voltage conversion circuit 4B (FIG. 4).

As described above, the current-to-voltage conversion circuit (4I) according to the tenth embodiment includes the first resistor (resistor 1001) having one end connected to one electrode (oscillator 22) included in the sensor (oscillation sensor 2) and the other end connected to the first electrical potential (V1), the first capacitor (capacitor 1002) having one end connected to the one end of the first resistor and the other end connected to the first current source (current source 1003), the first transistor (transistor 1004) having the first terminal (emitter) connected to the other end of the first capacitor, the second terminal (collector) connected to the first output terminal (T1), and the control terminal (base) connected to the first voltage source (voltage source 1005), and the second resistor (resistor 1006) having one end connected to the second terminal of the first transistor and the other end connected to the second electrical potential (V2).

In the current-to-voltage conversion circuit (4I) according to the tenth embodiment, the voltage value of the second voltage is 0V, and the first transistor (transistor 1004) is a PNP-type transistor.

In this configuration, similar to the current-to-voltage conversion circuit 4B according the third embodiment, the main electrical potential of the oscillator 22 included in the oscillation sensor 2 can be fixed to the first electrical potential V1 such as GND level using the resistor 1001. Thereby, according to the current-to-voltage conversion circuit 4I of the tenth embodiment, the oscillation frequency obtained by the oscillation sensor 2 can be stabilized.

As shown in FIG. 11, by connecting the current-to-voltage conversion circuit 4I to the oscillator 22 and detecting the output current of the oscillator 22, the changes of oscillation, temperature, magnetic field, and the like can be detected.

Eleventh Embodiment

In the ninth embodiment, the current-to-voltage conversion circuit including the PMOS transistor was described. In the eleventh embodiment, a current-to-voltage conversion circuit including an NMOS transistor will be described.

Figure 12:
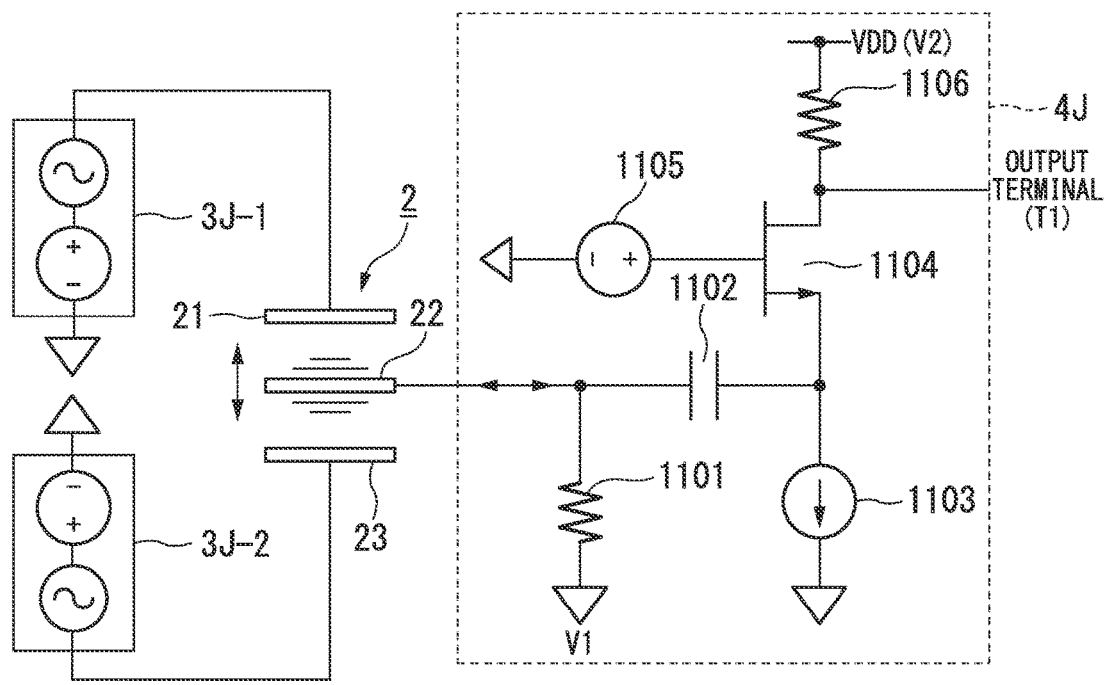
FIG. 12 is a circuit diagram showing a current-to-voltage conversion circuit using a NMOS transistor according to an eleventh embodiment.

FIG. 12 is a circuit diagram showing a current-to-voltage conversion circuit 4J using an NMOS transistor according to the eleventh embodiment.

As shown in FIG. 12, a bias power source 3J-1 is connected to a first fixed electrode 21 included in an oscillation sensor 2, the current-to-voltage conversion circuit 4J is connected to an oscillator 22, and a bias power source 3J-2 is connected to a second fixed electrode 23. Each of the bias power source 3J-1 and the bias power source 3J-2 is an alternating-current source.

The current-to-voltage conversion circuit 4J has the same configuration as that of the current-to-voltage conversion circuit 4A (FIG. 3).

As described above, the current-to-voltage conversion circuit (4J) according to the eleventh embodiment includes the first resistor (resistor 1101) having one end connected to one electrode (oscillator 22) included in the sensor (oscillation sensor 2) and the other end connected to the first electrical potential (V1), the first capacitor (capacitor 1102) having one end connected to the one end of the first resistor and the other end connected to the first current source (current source 1103), the first transistor (transistor 1104) having the first terminal (source) connected to the other end of the first capacitor, the second terminal (drain) connected to the first output terminal (T1), and the control terminal (gate) connected to the first voltage source (voltage source 1105), and the second resistor (resistor 1106) having one end connected to the second terminal of the first transistor and the other end connected to the second electrical potential (V2).

In the current-to-voltage conversion circuit (4J) according to the eleventh embodiment, the voltage value of the second voltage is a voltage value of a source voltage (VDD) and the first transistor (transistor 1104) is an N-type MOS transistor.

In this configuration, similar to the current-to-voltage conversion circuit 4A according the second embodiment, the main electrical potential of the oscillator 22 included in the oscillation sensor 2 can be fixed to the first electrical potential V1 such as GND level using the resistor 1101. Thereby, according to the current-to-voltage conversion circuit 4J of the eleventh embodiment, the oscillation frequency obtained by the oscillation sensor 2 can be stabilized.

As shown in FIG. 12, by connecting the current-to-voltage conversion circuit 4J to the oscillator 22 and detecting the output current of the oscillator 22, the changes of oscillation, temperature, magnetic field, and the like can be detected.

Twelfth Embodiment

In the ninth embodiment, the current-to-voltage conversion circuit including the PMOS transistor was described. In the twelfth embodiment, a current-to-voltage conversion circuit including an NPN transistor will be described.

Figure 13:
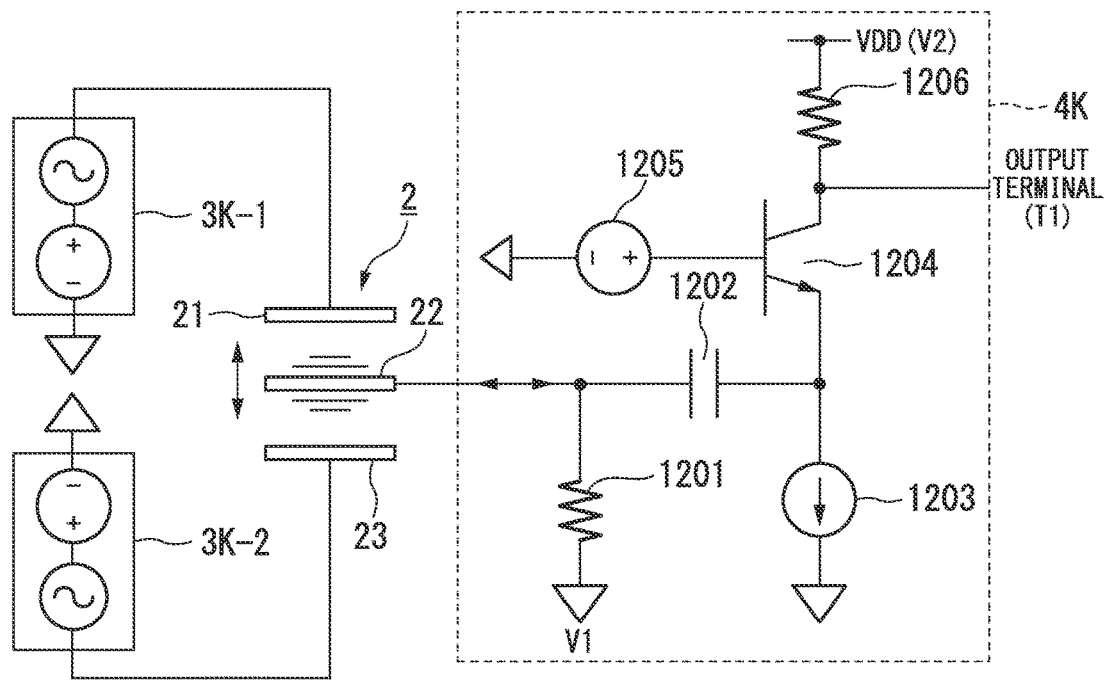
FIG. 13 is a circuit diagram showing a current-to-voltage conversion circuit using an NPN transistor according to a twelfth embodiment.

FIG. 13 is a circuit diagram showing a current-to-voltage conversion circuit 4K using an NPN transistor according to the twelfth embodiment.

As shown in FIG. 13, a bias power source 3K-1 is connected to a first fixed electrode 21 included in an oscillation sensor 2, the current-to-voltage conversion circuit 4K is connected to an oscillator 22, and a bias power source 3K-2 is connected to a second fixed electrode 23. Each of the bias power source 3K-1 and the bias power source 3K-2 is an alternating-current source.

The current-to-voltage conversion circuit 4K has the same configuration as that of the current-to-voltage conversion circuit 4C (FIG. 5).

As described above, the current-to-voltage conversion circuit (4K) according to the twelfth embodiment includes the first resistor (resistor 1201) having one end connected to one electrode (oscillator 22) included in the sensor (oscillation sensor 2) and the other end connected to the first electrical potential (V1), the first capacitor (capacitor 1202) having one end connected to the one end of the first resistor and the other end connected to the first current source (current source 1203), the first transistor (transistor 1204) having the first terminal (emitter) connected to the other end of the first capacitor, the second terminal (collector) connected to the first output terminal (T1), and the control terminal (base) connected to the first voltage source (voltage source 1205), and the second resistor (resistor 1206) having one end connected to the second terminal of the first transistor and the other end connected to the second electrical potential (V2).

In the current-to-voltage conversion circuit (4K) according to the twelfth embodiment, the voltage value of the second voltage is a source voltage, and the first transistor (transistor 1204) is an NPN-type transistor.

In this configuration, similar to the current-to-voltage conversion circuit 4C according the fourth embodiment, the main electrical potential of the oscillator 22 included in the oscillation sensor 2 can be fixed to the first electrical potential V1 such as GND level using the resistor 1201. Thereby, according to the current-to-voltage conversion circuit 4K of the twelfth embodiment, the oscillation frequency obtained by the oscillation sensor 2 can be stabilized.

As shown in FIG. 13, by connecting the current-to-voltage conversion circuit 4K to the oscillator 22 and detecting the output current of the oscillator 22, the changes of oscillation, temperature, magnetic field, and the like can be detected.

The transistor described in the first to twelfth embodiments may be a junction field effect transistor (FET), a MOS FET, or the like.

In the first to twelfth embodiments, the configuration where the output current of the oscillation sensor 2 is converted to the voltage, but the present invention is not limited to this configuration. Output current where the electrical potential of the current value is changed based on the influence of temperature, humidity, surrounding magnetic field, oscillation, and the like may be subjected to the current-to-voltage conversion process.

The present invention is not limited to the above-stated embodiments, and can be freely modified within the scope of the present invention. In addition, the above-stated combination of elements can be freely modified.

What is claimed is:

1. A current-to-voltage conversion circuit, comprising:
   a first resistor including a first end and a second end, the first end of the first resistor being connectable to an electrode included in a sensor, the second end of the first resistor being connected to a first electrical potential, the first resistor being configured to fix, to the first electrical potential, an electrical potential input from the sensor;
   a first current source;
   a first capacitor including a first end and a second end, the first end of the first capacitor being connected to the first end of the first resistor, the first end of the first capacitor being connectable to the electrode included in the sensor, the second end of the first capacitor being connected to the first current source;
   a first output terminal;
   a first voltage source;
   a first transistor including a first terminal, a second terminal, and a control terminal, the first terminal being connected to the second end of the first capacitor, the second terminal being connected to the first output terminal, the control terminal being connected to the first voltage source; and
   a second resistor including a first end and a second end, the first end of the second resistor being connected to the second terminal, the second end of the second resistor being connected to a second electrical potential.

2. The current-to-voltage conversion circuit according to claim 1, wherein the first transistor is a P-type MOS transistor and includes a source, a drain, and a gate,
   the first terminal is the source,
   the second terminal is the drain, and
   the control terminal is the gate.

3. The current-to-voltage conversion circuit according to claim 2, wherein the second electrical potential is 0V.

4. The current-to-voltage conversion circuit according to claim 1, wherein the first transistor is an N-type MOS transistor and includes a source, a drain, and a gate,
   the first terminal is the source,
   the second terminal is the drain, and
   the control terminal is the gate.

5. The current-to-voltage conversion circuit according to claim 4, wherein the second electrical potential is a positive source electrical potential.

6. The current-to-voltage conversion circuit according to claim 1, wherein the first transistor is a PNP-type transistor and includes an emitter, a collector, and a base,
   the first terminal is the emitter,
   the second terminal is the collector, and
   the control terminal is the base.

7. The current-to-voltage conversion circuit according to claim 6, wherein the second electrical potential is 0V.

8. The current-to-voltage conversion circuit according to claim 1, wherein the first transistor is an NPN-type transistor and includes an emitter, a collector, and a base,
   the first terminal is the emitter,
   the second terminal is the collector, and
   the control terminal is the base.

9. The current-to-voltage conversion circuit according to claim 8, wherein the second electrical potential is a positive source electrical potential.

10. The current-to-voltage conversion circuit according to claim 1, wherein the first end of the first resistor is connectable to an oscillator included in the sensor.

11. The current-to-voltage conversion circuit according to claim 1, wherein the control terminal is connected to a positive electrode included in the first voltage source.

12. A circuit, comprising:
    a current-to-voltage conversion circuit according to claim 1; and
    another current-to-voltage conversion circuit, comprising:
      a third resistor including a first end and a second end, the first end of the third resistor being connectable to another electrode included in the sensor, the second end of the third resistor being connected to a third electrical potential, the third resistor being configured to fix, to the third electrical potential, an electrical potential input from the sensor;
      a second current source;
      a second capacitor including a first end and a second end, the first end of the second capacitor being connected to the first end of the third resistor, the first end of the second capacitor being connectable to the another electrode included in the sensor, the second end of the second capacitor being connected to the second current source;
      a second output terminal;
      a second voltage source;
      a second transistor including a first terminal, a second terminal, and a control terminal, the first terminal of the second transistor being connected to the second end of the second capacitor, the second terminal of the second transistor being connected to the second output terminal, the control terminal of the second transistor being connected to the second voltage source; and
      a fourth resistor including a first end and a second end, the first end of the fourth resistor being connected to the second terminal of the second transistor, the second end of the fourth resistor being connected to a fourth electrical potential.

13. The circuit according to claim 12, wherein each of the first transistor and the second transistor is a P-type MOS transistor and includes a source, a drain, and a gate, the first terminal of the first transistor and the first terminal of the second transistor are the source of the first transistor and the source of the second transistor, respectively, the second terminal of the first transistor and the second terminal of the second transistor are the drain of the first transistor and the drain of the second transistor, respectively, and the control terminal of the first transistor and the control terminal of the second transistor are the gate of the first transistor and the gate of the second transistor, respectively.

14. The circuit according to claim 12, wherein each of the first transistor and the second transistor is an N-type MOS transistor and includes a source, a drain, and a gate, the first terminal of the first transistor and the first terminal of the second transistor are the source of the first transistor and the source of the second transistor, respectively, the second terminal of the first transistor and the second terminal of the second transistor are the drain of the first transistor and the drain of the second transistor, respectively, and the control terminal of the first transistor and the control terminal of the second transistor are the gate of the first transistor and the gate of the second transistor, respectively.

15. The circuit according to claim 12, wherein each of the first transistor and the second transistor is a PNP-type transistor and includes an emitter, a collector, and a base, the first terminal of the first transistor and the first terminal of the second transistor are the emitter of the first transistor and the emitter of the second transistor, respectively, the second terminal of the first transistor and the second terminal of the second transistor are the collector of the first transistor and the collector of the second transistor, respectively, and the control terminal of the first transistor and the control terminal of the second transistor are the base of the first transistor and the base of the second transistor, respectively.

16. The circuit according to claim 12, wherein each of the first transistor and the second transistor is an NPN-type transistor and includes an emitter, a collector, and a base, the first terminal of the first transistor and the first terminal of the second transistor are the emitter of the first transistor and the emitter of the second transistor, respectively, the second terminal of the first transistor and the second terminal of the second transistor are the collector of the first transistor and the collector of the second transistor, respectively, and the control terminal of the first transistor and the control terminal of the second transistor are the base of the first transistor and the base of the second transistor, respectively.

17. A self-oscillation circuit, comprising:

a bias power source;

a sensor comprising an oscillator connected to the bias power source, a first electrode, and a second electrode;

a current-to-voltage conversion circuit connected to the first electrode, comprising:
  a first resistor including a first end and a second end, the first end of the first resistor being connected to the first electrode, the second end of the first resistor being connected to a first electrical potential;
  a first current source;
  a first capacitor including a first end and a second end, the first end of the first capacitor being connected to the first end of the first resistor, the second end of the first capacitor being connected to the first current source;
  a first output terminal;
  a first voltage source;
  a first transistor including a first terminal, a second terminal, and a control terminal, the first terminal being connected to the second end of the first capacitor, the second terminal being connected to the first output terminal, the control terminal being connected to the first voltage source; and
  a second resistor including a first end and a second end, the first end of the second resistor being connected to the second terminal, the second end of the second resistor being connected to a second electrical potential;

an amplitude detector including an input and an output, the input of the amplitude detector being connected to the first output terminal;

a second voltage source;

an error integrator including a first input, a second input, and an output, the first input of the error integrator being connected to the output of the amplitude detector, the second input of the error integrator being connected to the second voltage source;

an attenuator including a first input, a second input, and an output, the first input of the attenuator being connected to the first output terminal, the second input of the attenuator being connected to the output of the error integrator; and a buffer including an input and an output, the input of the buffer being connected to the output of the attenuator, the output of the buffer being connected to the second electrode.

18. The self-oscillation circuit according to claim 17, wherein the first resistor is configured to fix an electrical potential input from the sensor.

* * * * *